US012796409B2

(12) United States Patent
Zhou et al.

(10) Patent No.: US 12,796,409 B2
(45) Date of Patent: Nov. 10, 2026

(54) FACTORY SYSTEM AND METHOD FOR FORMING SEMICONDUCTOR STRUCTURE

(71) Applicants: TAIWAN SEMICONDUCTOR MANUFACTURING COMPANY, LTD., Hsinchu (TW); TSMC CHINA COMPANY LIMITED, Shanghai (CN)

(72) Inventors: Xianhui Zhou, Shanghai City (CN); Lei Wang, Shanghai City (CN); Jie Chen, Shanghai City (CN); Zihao Zhang, Shanghai City (CN); Renqin Liao, Shanghai City (CN); Jilong Gu, Shanghai City (CN)

(73) Assignees: TAIWAN SEMICONDUCTOR MANUFACTURING COMPANY, LTD., Hsinchu (TW); TSMC CHINA COMPANY LIMITED, Shanghai (CN)

( * ) Notice: Subject to any disclaimer, the term of this patent is extended or adjusted under 35 U.S.C. 154(b) by 762 days.

(21) Appl. No.: 18/190,763

(22) Filed: Mar. 27, 2023

(65) Prior Publication Data

US 2024/0222120 A1 Jul. 4, 2024

(30) Foreign Application Priority Data

Dec. 30, 2022 (CN) ......................... 202223564476.7

(51) Int. Cl.
*H10P 76/20* (2026.01)
*H10P 72/30* (2026.01)
*H10P 76/40* (2026.01)

(52) U.S. Cl.
CPC ...... *H10P 76/2041* (2026.01); *H10P 72/3402* (2026.01); *H10P 72/3404* (2026.01); *H10P 76/4085* (2026.01)

(58) Field of Classification Search
CPC ............. H10P 72/0474; H10P 72/3402; H10P 72/3404; H10P 72/0612; H10P 76/2041; H10P 76/4085; Y02P 70/50
See application file for complete search history.

(56) References Cited

U.S. PATENT DOCUMENTS 6,162,010 A * 12/2000 Ishizawa ............. H10P 72/0454 414/217
6,580,958 B1 * 6/2003 Takano ............... H10P 72/0612 700/121

(Continued)

FOREIGN PATENT DOCUMENTS

WO WO-2015037701 A1 * 3/2015 .......... H10P 72/3302

OTHER PUBLICATIONS

Hong Xiao, Introduction to Semiconductor Manufacturing Technology, Second Edition, SPIE Press, 2012.

*Primary Examiner* — Peter B Kim
(74) *Attorney, Agent, or Firm* — Maschoff Brennan

(57) ABSTRACT

A method includes performing a coating process on a first one of wafers to form a photoresist layer using a coating tool; after performing the coating process, retrieving the first one of the wafers to a cassette docked on the coating tool; transferring the cassette from the coating tool to a load port of an exposure tool external to the coating tool; transferring the first one of the wafers from the cassette on the load port of the exposure tool to a wafer stage of the exposure tool; performing an exposing process on the first one of the wafers to pattern the photoresist layer on the first one of the wafers.

20 Claims, 29 Drawing Sheets

(56) References Cited

U.S. PATENT DOCUMENTS

2007/0166030 A1* 7/2007 Lee .................... H10P 72/0474
396/611
2009/0005998 A1* 1/2009 Orishimo ........... H10P 72/0616
702/15
2010/0195066 A1* 8/2010 Kim .................... H10P 72/0474
355/27
2021/0402607 A1* 12/2021 Pavlik .................... B25J 9/1674

* cited by examiner

FACTORY SYSTEM AND METHOD FOR FORMING SEMICONDUCTOR STRUCTURE

BACKGROUND

The present application claims priority to China Application Serial Number 202223564476.7, filed Dec. 30, 2022, which is herein incorporated by reference.

BACKGROUND

Semiconductor integrated circuit (IC) industry has experienced rapid growth. Technological advances in IC materials and design have produced generations of ICs where each generation has smaller and more complex circuits than the previous generation. However, these advances have increased the complexity of processing and manufacturing ICs and, for these advances to be realized, similar developments in IC processing and manufacturing are needed.

In the course of IC evolution, functional density (i.e., the number of interconnected devices per chip area) has generally increased while geometry size (i.e., the smallest component (or line) that can be created using a fabrication process) has decreased. This scaling down process generally provides benefits by increasing production efficiency and lowering associated costs. Such scaling-down also produces a relatively high power dissipation value, which may be addressed by using low power dissipation devices such as complementary metal-oxide-semiconductor (CMOS) devices.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
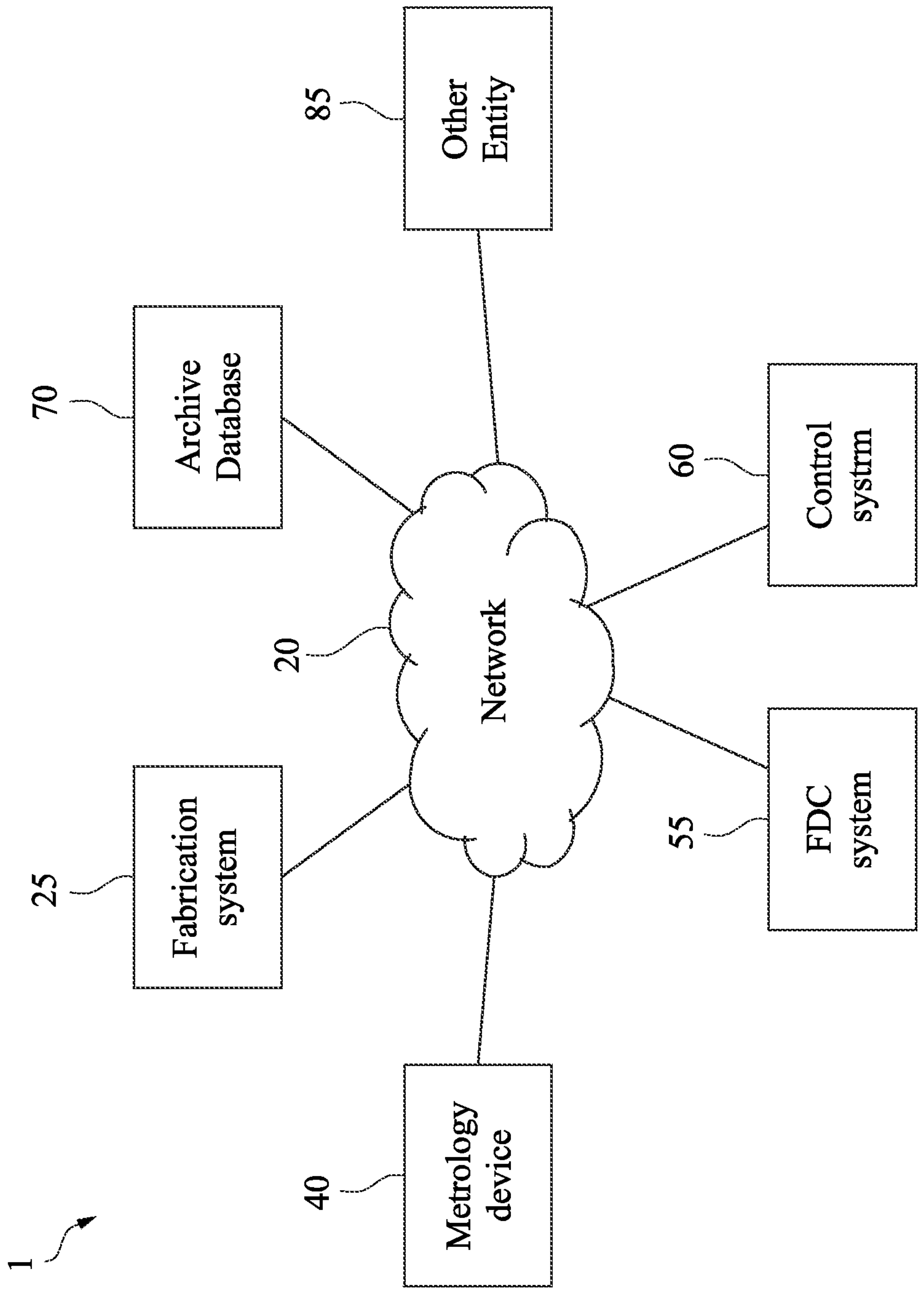
FIG. 1 is a block diagram of a fabrication facility in accordance with some embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

As used herein, "around," "about," "approximately," or "substantially" may mean within 20 percent, or within 10 percent, or within 5 percent of a given value or range. One skilled in the art will realize, however, that the value or range recited throughout the description are merely examples, and may be reduced with the down-scaling of the integrated circuits. Numerical quantities given herein are approximate, meaning that the term "around," "about," "approximately," or "substantially" can be inferred if not expressly stated.

Unless otherwise defined, all terms (including technical and scientific terms) used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

In the course of IC evolution, functional density (i.e., the number of interconnected devices per chip area) has generally increased while geometry size (i.e., the smallest component (or line) that can be created using a fabrication process) has decreased. For these advances to be realized, coating, exposing, and developing processes in IC processing and manufacturing are needed. However, during the exposing process on wafers having diameters, such as 200 mm, using a lithography tool having one exposure stage may have a lower productivity.

Therefore, the present disclosure in various embodiments provides a method for exposing wafers having diameters, such as about 200 mm, using a lithography tool having a dual-wafer-stage configuration. The lithography tool having the dual-stage configuration can improve throughput and processing efficiency of manufacturing processes. In addition, the lithography tool can be also in a semi-track configuration, such that the lithography tool and the coater/developing chamber each have its own load ports to receiving cassette accommodating the wafers, but not be arranged in a same track, which in turn solves a mismatch issue of process time between different manufacturing processes and further improve throughput and processing efficiency of the manufacturing processes.

Reference is made to FIG. 1. FIG. 1 is a block diagram of a fabrication facility in accordance with some embodiments of the present disclosure. The fabrication facility 1 implements integrated circuit manufacturing processes to fabricate integrated circuit devices. For example, the fabrication facility 1 may implement semiconductor manufacturing processes that fabricate semiconductor wafers. It should be noted that, in FIG. 1, the fabrication facility 1 has been simplified for the sake of clarity to better understand the concepts of the present disclosure. Additional features can be added in the fabrication facility 1, and some of the features described below can be replaced or eliminated in other embodiments of the fabrication facility 1. The fabrication facility 1 may include more than one of each of the entities. In some embodiments, and may further include other entities not illustrated in the depicted embodiment. In some embodiments, the fabrication facility 1 can include a network 20 that enables various entities (a fabrication system 25, a metrology device 40, a fault detection and classification (FDC) system 55, a control system 60, an archive data base 70, and another entity 85) to communicate with one another. The network 20 may be a single network or a variety of different networks, such as an intranet, the Internet, another network, or a combination thereof. The network 20 may include wired communication channels, wireless communication channels, or a combination thereof.

Figure 2A:
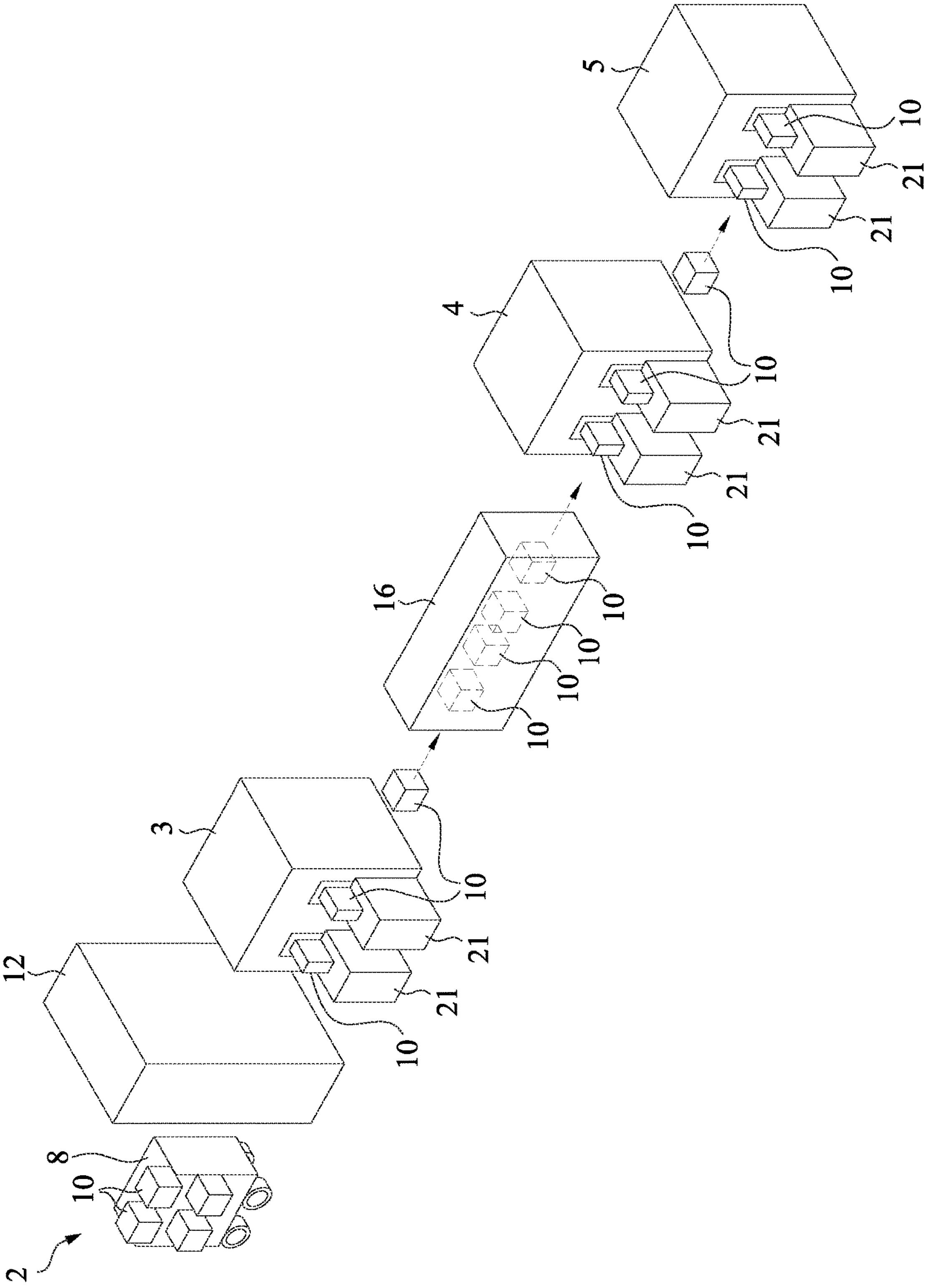
FIG. 2A illustrates a semiconductor fabrication plant including trolleys, production tools, stockers, and a wafer transport channel in accordance with some embodiments of the present disclosure.

Reference is made to FIG. 2A. FIG. 2A illustrates an exemplary manufacturing line 2 implementing integrated circuit manufacturing processes to fabricate integrated circuit devices. For example, the manufacturing line 2 may implement semiconductor manufacturing processes that fabricate semiconductor wafers. It should be noted that, in FIG. 2A, the manufacturing line 2 has been simplified for the sake of clarity to better understand the concepts of the present disclosure. As shown in FIG. 2A, the manufacturing line 2 may include production tools including a coating apparatus 3, and an exposure apparatus 4, and a developing apparatus 5. The manufacturing line may further include a trolley 8, a stocker 12, and a wafer transport channel 16. The trolley 8 and wafer transport channel 16 can be used to transport the wafer carriers 10. In some embodiments, the wafer carriers 10 can be interchangeably referred to as wafer holders, cassettes, or front opening unified pods (FOUPs). In some manufacturing processes, wafers need to go through one or more of the above-discussed tools. For example, the wafer carriers 10 may be transported by the trolley 8 into the stocker 12, which has a wafer storage for storing wafers. The wafers holders 10 may also be transported to the load ports 21, which load wafers into and take wafers out of the coating apparatus 3. The coating apparatus 3 can perform manufacturing steps to the wafers. Subsequently, the wafer carriers 10 may be transported to the exposure apparatus 4, and the next manufacturing step is performed. Subsequently, the wafer carriers 10 may be transported to the developing apparatus 5. The transportation between the production tools may be performed using the trolleys 8 or the automatic wafer transport channel 16. In some embodiments, the apparatus can be interchangeably referred to as a tool.

Figure 2B:
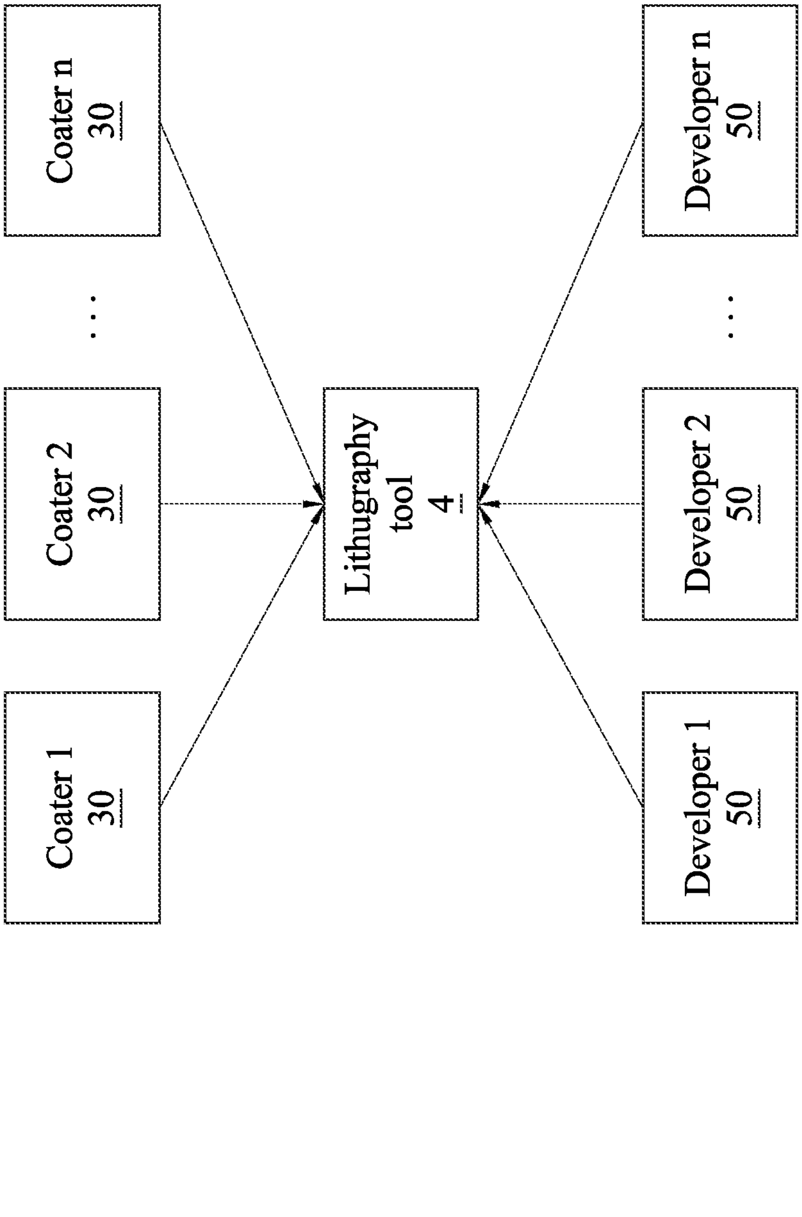
FIG. 2B is a block diagram of production tools in accordance with some embodiments of the present disclosure.

Reference is made to FIG. 2B. FIG. 2B is a block diagram of a exposure apparatus 4, multiple coaters 30 (see FIGS. 5A and 5B) in the coating apparatus 3, and multiple developing chambers 50 (see FIGS. 13A and 13B) in the developing apparatus 5 in accordance with some embodiments of the present disclosure. In some embodiments, the developing chamber 50 can be interchangeably referred to as a developer as shown in FIG. 2B. In the manufacturing line 2, the coating apparatus 3, the exposure apparatus 4, and the developing apparatus 5 as shown in FIG. 2A each have its own load ports 21 to receiving wafer carriers 10 accommodating the wafers. As shown in FIG. 2B, the exposure apparatus 4 can cooperate with multiple coaters 30 (see FIGS. 5A and 5B) in the coating apparatus 3 and multiple developing chambers 50 (see FIGS. 13A and 13B) in the developing apparatus 5, which in turn improves throughput and processing efficiency of the manufacturing line 2 and makes the manufacturing process more flexible. Multiple coaters 30 can be divided into multiple groups assembled in different coating apparatuses 3, each group may contains at least one of the coaters 30, and multiple developing chambers 50 can be divided into multiple groups assembled in different developing apparatuses 5, each group contains at least one of the developing chambers 50. If the exposure apparatus 4 are integrated with the coaters 30 and the developing chambers 50 to share load port 21, due to the mismatch of process time between different manufacturing processes, the processing chamber with a shorter process time will be idle to wait for the manufacturing process of the processing chamber with a longer process time to complete before proceeding to the next step, which in turn reduces throughput and processing efficiency of the manufacturing line 2. For example, if the exposure apparatus 4 has a shorter process time than the coater 30/developing chamber 50 and integrated with the coater 30/developing chamber 50, when the exposure apparatus 4 is in process, the exposure apparatus 4 will be idle and cannot serve other wafers until the process in the coater 30/developing chamber 50 are complete. In addition, if the exposure apparatus 4 are integrated with the coater 30 and/or the developing chamber 50, when one of the exposure apparatus 4, the coater 30, and the developing chamber 50 is shut down for maintenance, the others of the exposure apparatus 4, the coater 30, and the developing chamber 50 may be accordingly shut down with the said one, which also in turn reduces throughput and processing efficiency of the manufacturing line 2. In some embodiments, the configuration shown in FIG. 2B can be interchangeably referred to as a semi-track configuration or a semi-track mode.

Figure 3:
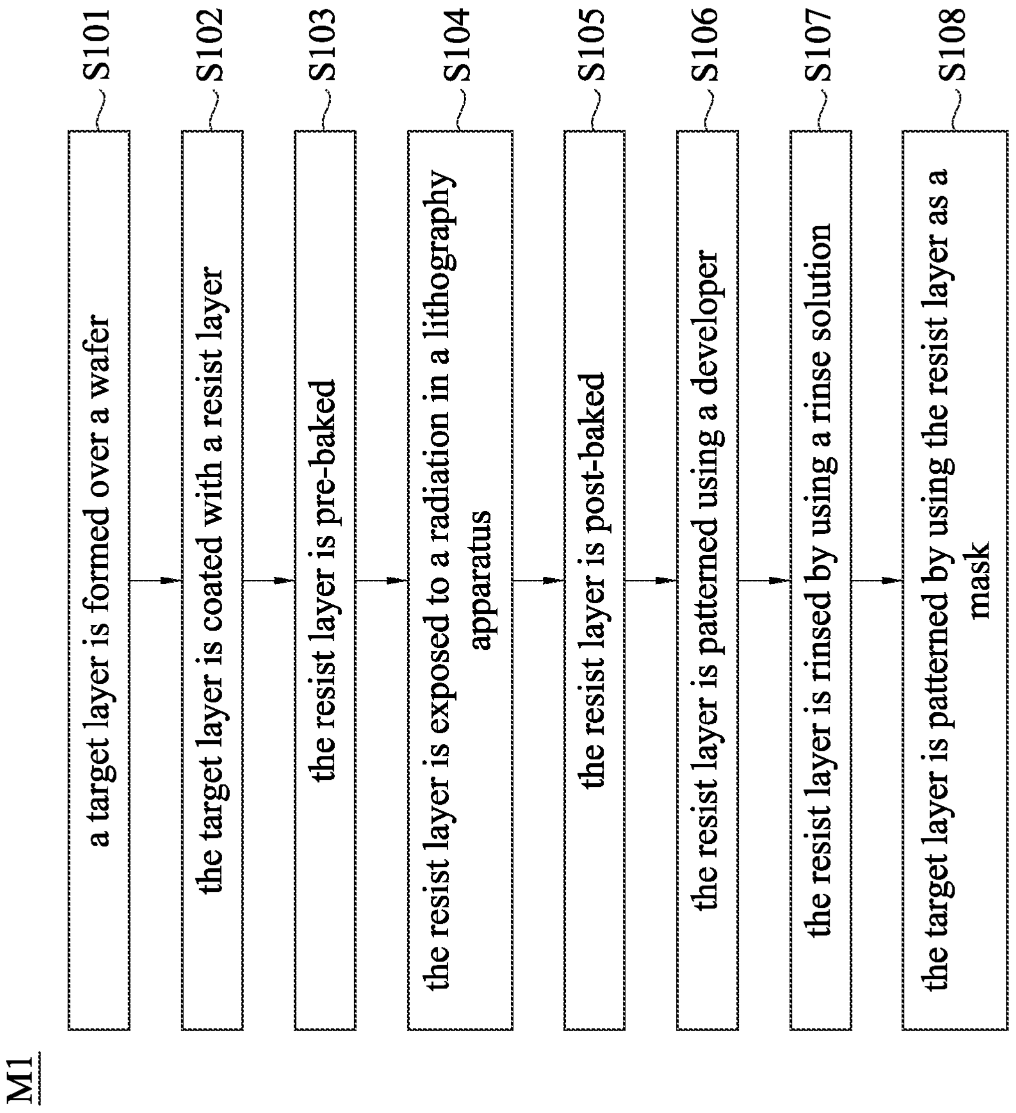
FIG. 3 is a flowchart illustrating a method for semiconductor manufacturing in accordance with some embodiments of the present disclosure.

Reference is made to FIG. 3. FIG. 3 illustrates an exemplary method M1 for fabrication of a semiconductor device in accordance with some embodiments. The method M1 includes a relevant part of the entire manufacturing process. The method M1 may be implemented, in whole or in part, by a system employing deep ultraviolet (DUV) lithography, extreme ultraviolet (EUV) lithography, electron beam (e-beam) lithography, x-ray lithography, and other appropriate lithography processes to improve pattern dimension accuracy. Additional operations can be provided before, during, and after the method M1, and some operations described can be replaced, eliminated, modified, moved around, or relocated for additional embodiments of the method. One of ordinary skill in the art may recognize other examples of semiconductor fabrication processes that may benefit from aspects of the present disclosure. The method M1 is an example, and is not intended to limit the present disclosure beyond what is explicitly recited in the claims.

Figure 4A:
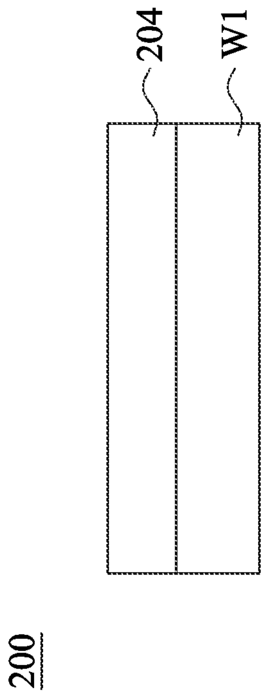
FIGS. 4A-4H illustrate cross-sectional views of a wafer at various stages of fabrication in accordance with some embodiments of the present disclosure.

The method M1 is described below in conjunction with FIGS. 4A-4H in which a semiconductor structure 200 is fabricated by using the method M1. FIGS. 4A-4H illustrate the semiconductor structure 200 at various stages of the method M1 according to some embodiments of the present disclosure. The method M1 begins at block S101 where a target layer is formed over a wafer. Referring to FIG. 4A, in some embodiments of block S101, the wafer W1 may have a diameter about 200 mm. In some embodiments, the wafer W1 may have a diameter less than about 300 mm. In some embodiments, the wafer W1 may include one or more layers of material or composition. In some embodiments, the wafer W1 is a semiconductor substrate. In another embodiment, the wafer W1 includes silicon in a crystalline structure. In some embodiments, the wafer W1 includes other elementary semiconductors such as germanium; a compound semiconductor such as silicon carbide, gallium arsenide, indium arsenide, and indium phosphide; an alloy semiconductor such as GaAsP, AlInAs, AlGaAs, InGaAs, GaInP, and/or GaInAsP; or combinations thereof. The wafer W1 may include a silicon on insulator (SOI) substrate, be strained/stressed for performance enhancement, include epitaxial regions, include isolation regions, include doped regions, include one or more semiconductor devices or portions thereof, include conductive and/or non-conductive layers, and/or include other suitable features and layers. In some embodiments, the wafer W1 can be interchangeably referred to as a semiconductor substrate.

Alternatively or additionally, the wafer W1 may include other elementary semiconductor materials such as germanium (Ge). In some embodiments, the wafer W1 is made of a compound semiconductor such as silicon carbide (SiC), gallium arsenic (GaAs), indium arsenide (InAs), or indium phosphide (InP). In some embodiments, the wafer W1 is made of an alloy semiconductor such as silicon germanium (SiGe), silicon germanium carbide (SiGeC), gallium arsenic phosphide (GaAsP), or gallium indium phosphide (GaInP). In some embodiments, the wafer W1 includes an epitaxial layer. For example, the wafer W1 has an epitaxial layer overlying a bulk semiconductor. In some embodiments, the wafer W1 may be a germanium-on-insulator (GOI) substrate. In some embodiments, the wafer W1 may have various device elements. Examples of device elements that are formed in the wafer W1 include transistors (e.g., metal oxide semiconductor field effect transistors (MOSFET), complementary metal oxide semiconductor (CMOS) transistors, bipolar junction transistors (BJT), high-voltage transistors, high-frequency transistors, p-channel and/or n-channel field-effect transistors (PFETs/NFETs), etc.), diodes, and/or other applicable elements. Various processes are performed to form the device elements, such as deposition, etching, implantation, photolithography, annealing, and/or other suitable processes. A target layer 204 may be formed on the wafer W1. In some embodiments, the target layer 204 may be a hard mask layer including material(s) such as amorphous silicon (a-Si), silicon oxide, silicon nitride (SiN), titanium nitride, or other suitable material or composition. In some embodiments, the target layer 204 may include an anti-reflection coating (ARC) layer such as a nitrogen-free anti-reflection coating (NFARC) layer including material(s) such as silicon oxide, silicon oxygen carbide, or plasma enhanced chemical vapor deposited silicon oxide. In some embodiments, the target layer 204 may be formed using, for example, CVD, PVD, ALD, spin-on-glass (SOG) or other suitable techniques.

Figure 4B:
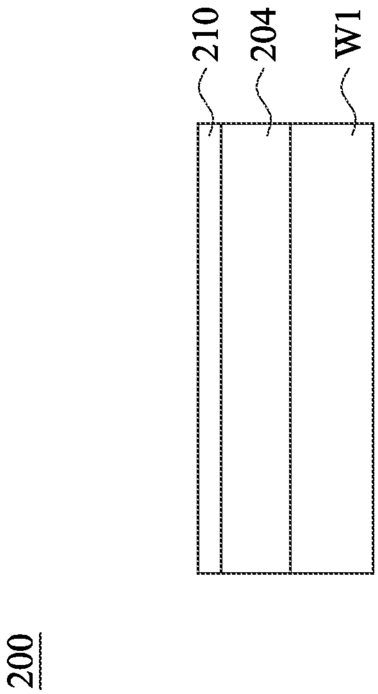

Returning to FIG. 3, the method M1 then proceeds to block S102 where the target layer is coated with a resist layer. In some embodiments of block S102, as illustrated in FIG. 4B, a resist layer 210 may be coated on the target layer 204 using a spin-on coating method through a coating apparatus 3 (see FIG. 5A). In detail, a liquid film, such as a liquid material of the resist layer 210, can be dispensed on the wafer W1 through a dispensing nozzle 331 (see FIG. 5B) in a processing chamber (e.g. coater 30) of the coating apparatus 3, and the wafer stage 320 simultaneously rotates the wafer W1 at a rotational speed. In some embodiments, the dispensing nozzle 331 scans across the surface of the wafer W1 during the coating. In some embodiments, the resist layer 210 may be a deep UV photoresist. The resist layer 210 may be either a positive tone or a negative tone material, which is then exposed and developed in an aqueous base solution to form a pattern which will be transferred to the underlying target layer for defining a trench thereon in subsequent processes. It is noted that the number of layer in the resist layer 210 is exemplary. In some embodiments, the resist layer 210 may be a multi-layered structure.

Figure 5A:
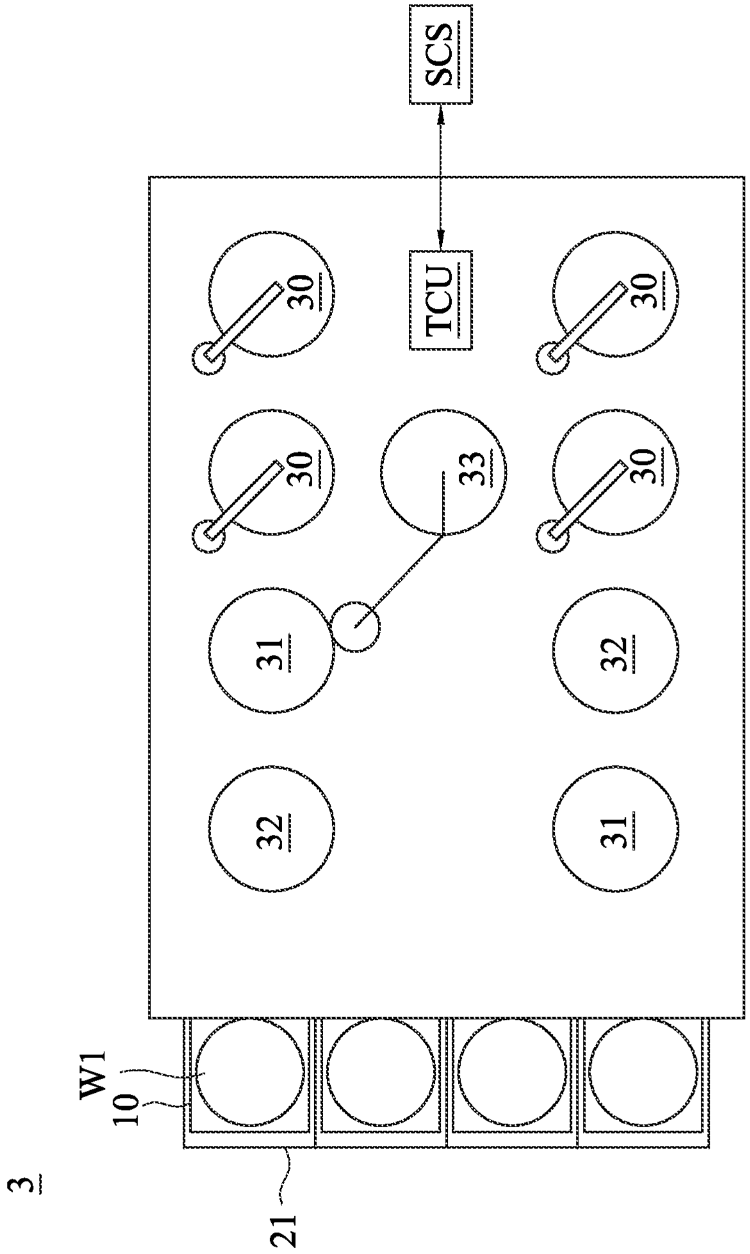
FIGS. 5A and 5B show schematic top and cross-sectional views of one stage of a method for transporting a wafer in a coating apparatus in accordance with some embodiments of the present disclosure.

In some embodiments, the cross-sectional view of the wafer W1 in FIG. 4B will be described along with the drawings shown in FIGS. 5A and 5B. Some of the described stages can be replaced or eliminated in different embodiments. As shown in FIG. 5A, the coating apparatus 3 may include processing chambers that include spin coaters 30 to deposit resist layer 210, chill plates 31, and bake plates 32. The coating apparatus 3 may further include input/output load ports 21 and transferring module 33. The transferring module 33 picks up wafer from the input/output load ports 21, moves them between the different processing chambers and delivers then to a loading bay of the coating apparatus 3. In some embodiments, the transferring module 33 can be interchangeably referred to as a substrate handler or a robot. These devices, which are often collectively referred to as the track, are under the control of a track control unit TCU which is itself controlled by a supervisory control system SCS.

Figure 5B:
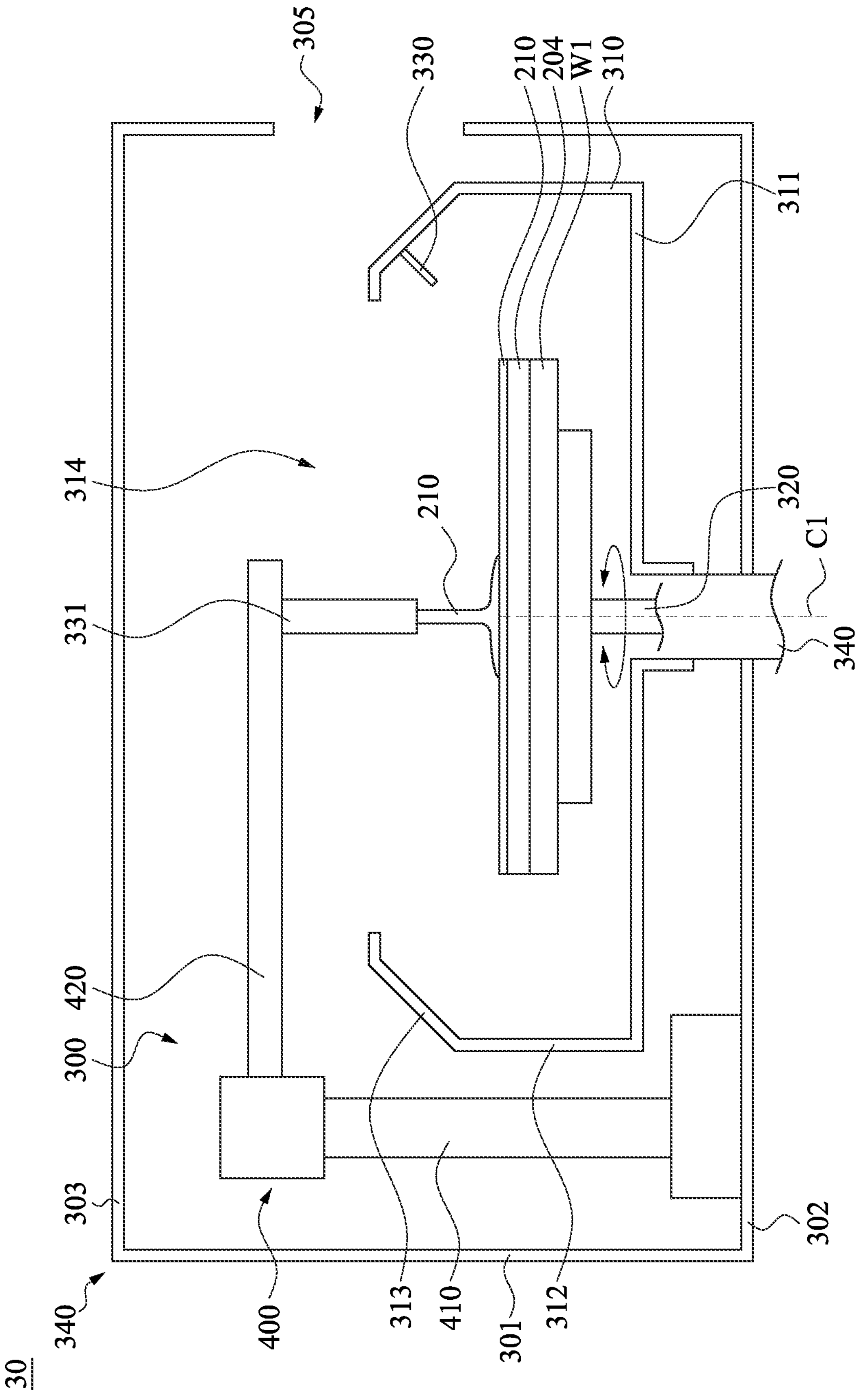

In FIG. 5B, the spin coater 30 may include a processing chamber 340 and a liquid dispensing module 400. The processing chamber 340 has an interior space 300 defined by a number of walls, such as a lateral wall 301, a bottom wall 302, and a top wall 303. The lateral wall 301 is connected to edges of the bottom wall 302 and extends away from the bottom wall 302. The top wall 303 is connected to the distal end of the lateral wall 301. In some embodiments, the interior space 300 is secluded from the ambient environment. The interior space 300 communicates to the ambient environment via a slot 305 formed on the lateral wall 301. The slot 305 allows the transferring module to pass through. The processing chamber 340 may further include a catch cup 310, a wafer stage 320, and an edge bead rinse (EBR) nozzle 330, in accordance with some embodiments. The catch cup 310, the wafer stage 320, and the EBR nozzle 330 are positioned in the interior space 300. In some embodiments, the catch cup 310 can be configured to provide an environment for coating a layer (e.g., the resist layer 210) on the wafer W1. The catch cup 310 is a circular cup having an open top 314. The upper portion 313 of the cup wall 312 tilts inward to facilitate retaining waste photoresist within the catch cup 310. The catch cup 310 is connected to an exhaust system via a liquid waste drain formed on the bottom wall 302. As a result, the catch cup 310 is able to catch and drain waste liquid solution in a liquid film spin-on coating process via the liquid waste drain. In some embodiments, the wafer stage 320 is disposed in the catch cup 310. In some embodiments, the wafer stage 320 is configured for holding, positioning, moving, and otherwise manipulating the wafer W1. In some embodiments, the wafer stage 320 is arranged to rotate about a main axis C1. The wafer W1 may be secured on the wafer stage 320 by a clamping mechanism, such as vacuum clamping or e-chuck clamping. The wafer stage 320 is designed and configured to be operable for translational and rotational motions. In some embodiments, the wafer stage 320 is further designed to tilt or dynamically change the tilt angle. In some embodiments, the wafer stage 320 is fitted with a suitable heating mechanism to heat the wafer W1 to a desired temperature. In some embodiments, the EBR nozzle 330 is disposed in the catch cup 310. The EBR nozzle 330 is used to supply a liquid solution over the wafer W1, when the wafer W1 is disposed in the catch cup 310. The EBR nozzle 330 is connected to a source unit (not shown) to receive the chemical solution from the source unit. The liquid dispensing module 400 may include a first drive mechanism 410, a second drive mechanism 420, and a dispensing nozzle 331 in accordance with some embodiments. In some embodiments, the first drive mechanism 410 is rotatable about a vertical axis as well. In some embodiments, the dispensing nozzle 331 is mounted at the second drive mechanism 420. The dispensing nozzle 331 is used to dispense a liquid to the wafer W1. The dispensing nozzle 331 is connected to a liquid source (not shown in figures) to receive the liquid.

Figure 4C:
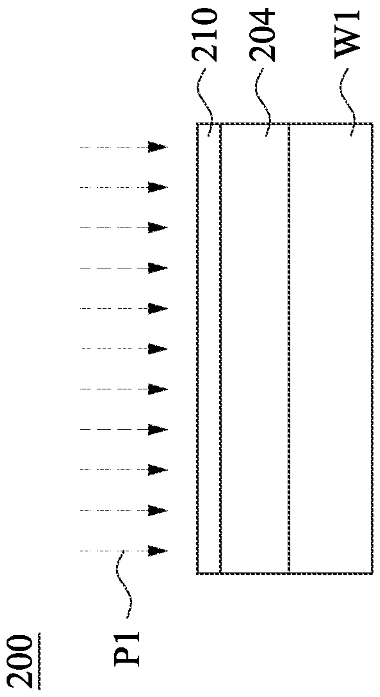

Returning to FIG. 3, the method M1 then proceeds to block S103 where the resist layer is pre-baked. With reference to FIG. 4C, in some embodiments of block S103, the wafer W1 may be transferred from the spin coater 30 to the bake plates 32 within the coating apparatus 3 (see FIG. 5A) to perform a pre-baking process P1 through the transferring module 33 (see FIG. 5A). The pre-baking process P1 may be performed at an elevated temperature to evaporate the solvent in the resist layer 210 for a time duration sufficient to cure and dry the resist layer 210.

Figure 4D:
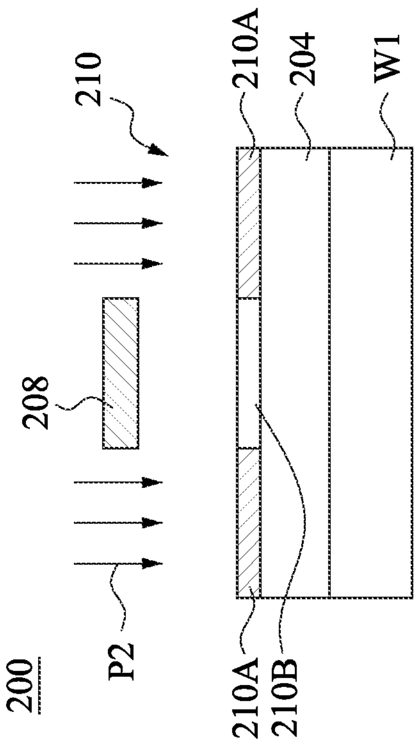

Returning to FIG. 3, the method M1 then proceeds to block S104 where the resist layer is exposed to a radiation in a lithography system. With reference to FIG. 4D, in some embodiments of block S104, an exposing process P2 is performed on the resist layer 210 in a lithography system. In some embodiments, the radiation generated by the exposing process P2 may be an I-line (365 nm), a DUV radiation such as KrF excimer laser (248 nm) or ArF excimer laser (193 nm), a EUV radiation (e.g., 13.8 nm), an e-beam, an x-ray, an ion beam, or other suitable radiations. The exposure may be performed in air, in a liquid (immersion lithography), or in a vacuum (e.g., for EUV lithography and e-beam lithography). In some embodiments, the radiation generated by the exposing process P2 may be patterned with a photomask or reticle (not shown), such as a transmissive mask or a reflective mask, which may include resolution enhancement techniques such as phase-shifting and/or optical proximity correction (OPC). In some embodiments, the radiation generated by the exposing process P2 may be directly modulated with a predefined pattern, such as an IC layout, without using a photomask (maskless lithography). In some embodiments, the radiation generated by the exposing process P2 may irradiate portions 210A of the resist layer 210 according to a pattern 208, either with a mask or maskless. Specifically, the irradiated portions 210A of the resist layer 210 may be portions exposed by the pattern 208. In some embodiments, the resist layer 210 may be a positive resist and the irradiated portions 210A become soluble in a developing chemical. In some embodiments, the resist layer 210 may be a negative resist and the unexposed portions 210B become insoluble in a developing chemical. In some embodiments, the exposing process P2 is performed for a shorter time duration than the coating process P1 shown in FIG. 4C.

In some embodiments, the cross-sectional view of the wafer W1 in FIG. 4D will be described along with the drawings shown in FIGS. 6A-12. Some of the described stages can be replaced or eliminated in different embodiments. The method further proceeds to an operation in which the wafer carrier 10 containing wafer W1 is transferred from the load port 21 of the coating apparatus 3 to dock on a load port 21 of the exposure apparatus 4. That is, the load port 21 of the exposure apparatus 4 external to the coating apparatus 3. Reference is made to FIGS. 6A to 6I.

Figure 6A:
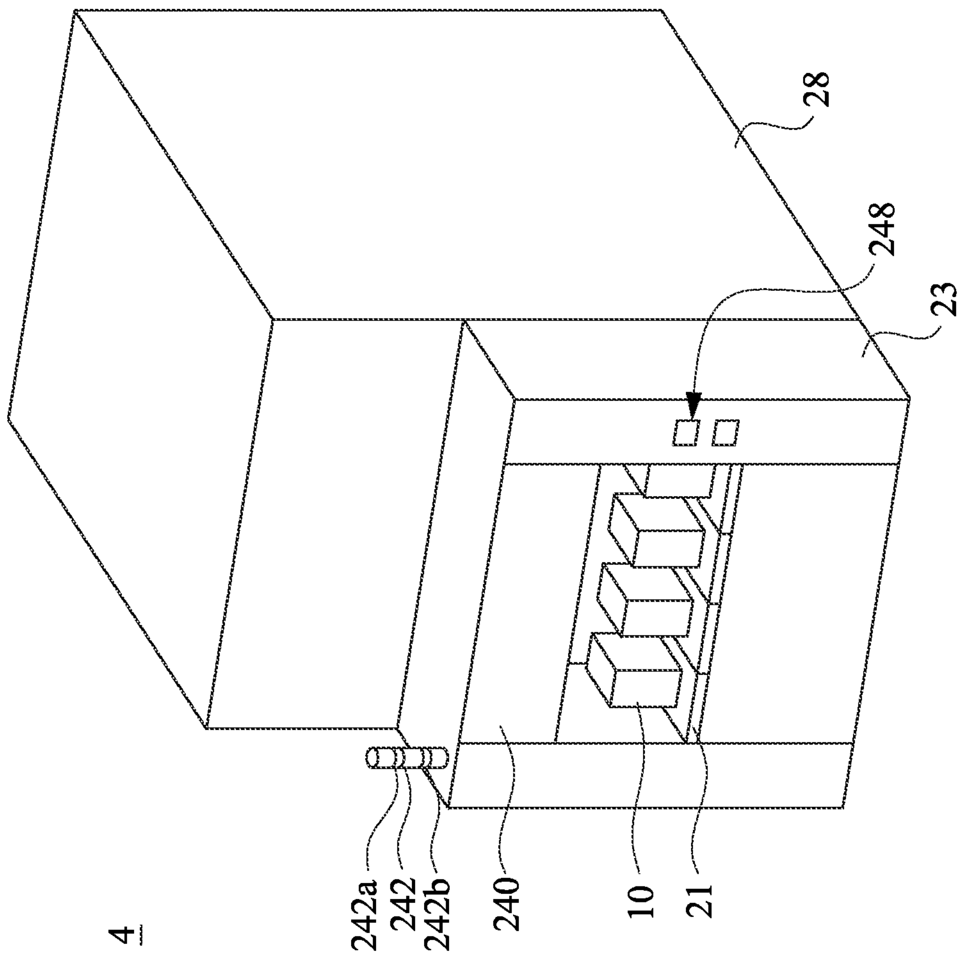
FIGS. 6A and 6B show schematic perspective and cross-sectional views of one stage of a method for transporting a wafer in a lithography exposure apparatus as the wafer is positioned over a load port in accordance with some embodiments of the present disclosure.
Figure 6B:
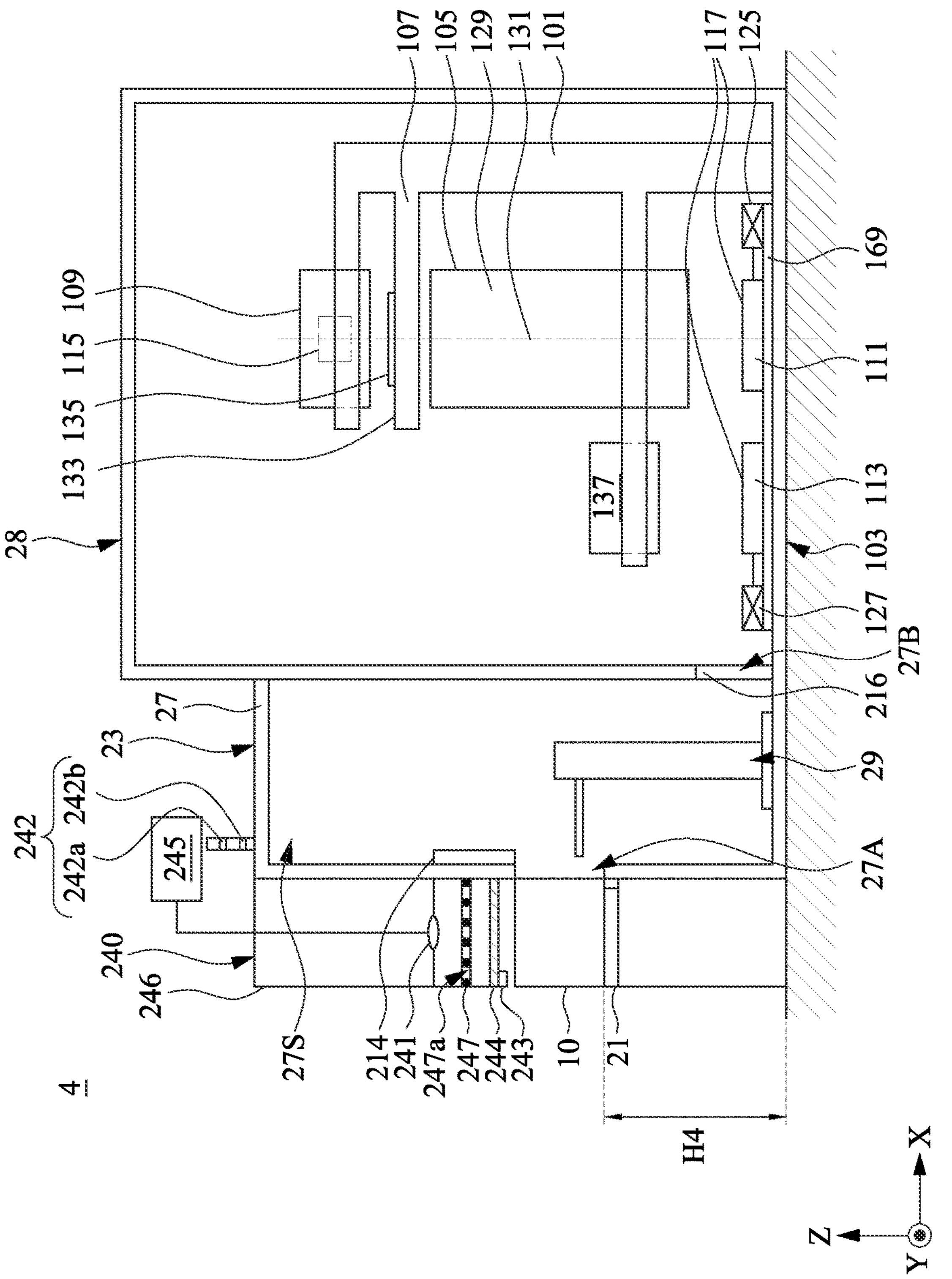

In FIG. 6A, the exposure apparatus 4 may include the load port 21, an interface module 23, and a vacuum vessel 28. It should be appreciated that the features described below can be replaced or eliminated in other embodiments of the exposure apparatus 4. By way of example but not limiting the present disclosure, the exposure apparatus 4 can include four load ports 21. It should be appreciated that the exposure apparatus 4 may include any number of the load ports 21. In FIG. 6B, the interface module 23 is configured to handle the wafer W1 from the wafer carrier 10 on the load port 21. The wafer carrier 10 can load multiple wafers and be transported by a suitable automated handling system, such as an overhead hoist transfer (OHT) (not shown). In some embodiments, the interface module 23 of the exposure apparatus 4 may include a sealed space 27S, which is surrounded by a housing 27 thereof. The housing 27 may be composed of a material with appropriate rigidity, such as stainless steel. The housing 27 may have a door opening 27A to connect to the wafer carrier 10. The housing 27 may have a door opening 27B to connect to the vacuum vessel 28. The interface module 23 may further include movable door covers 214 and 216 respectively located on the two side walls of the housing 27 and used to cover the door openings 27A and 27B of the housing 27 entering and exiting the sealed space 27S. The load port 21 may be disposed outside the sealed space 27S and located on or adjacent to the outer side surface of the interface module 23, wherein the load port 21 may be adjacent to the movable door cover 214 (or the door opening 27A). The load port 21 has a greater height H4 than the movable door cover 216 and such configuration is friendly to the operator or the technician since the operator or the technician is able to transport the wafer carriers 10 at a substantially same level and thus reduces the mistakes at transporting. In other words, the load port 21 of the exposure tool 4 is at a higher position than the wafer stage 111/113 of the exposure tool 4. By way of example but not limiting the present disclosure, the height H4 of the load port 21 of the lithography exposure tool 4 may be in a range from about 800 mm to about 1500 mm, such as about 800, 900, 1000, 1100, 1200, 1300, 1400, or 1500 mm. The movable door cover 214 can be operated to open or close the door opening 212A, thereby communicating or separating a space in the wafer carrier 10 and the sealed space 27S. Similarly, the movable door cover 216 can be operated to open or close the door opening 27B, thereby communicating or separating the sealed space 27S and the space in the vacuum vessel 28. In some embodiments, the interface module 23 can be interchangeably referred to as a factory interface (FI).

The exposure apparatus 4 may further include a gas blowing system 240 above the load ports 21 and adjacent to the interface module 23. The gas blowing system 240 may include a fan filter 241, a gas pressure detector 243, a gas filter element 244, a controller 245, and a housing 246. The fan filter 241, the gas pressure detector 243, and the gas filter element 244 may be disposed in the housing 246. The fan filter 241 may be arranged to blow air downwardly toward the load port 21, thereby generating a gas flow 249 (see FIG. 6C). In some embodiments, a gas dispersing plate 247 may be provided under the fan filter 241, which has a plurality of vent holes 247*a* to disperse the gas. The housing 246 of the gas blowing system 240 may be supported by the housing 27 of the interface module 23. The gas filter element 244 can be arranged under the fan filter 241, or even under the gas dispersing plate 247, to filter dust particles in the gas. In some embodiments, the gas dispersing plate 247 and/or the gas filter element 244 may be omitted. The gas pressure detector 243 may be disposed under the air fan filter 241 to detect the gas pressure around the load port 21 and/or the wafer carrier 10. In some embodiments, a sealing element is provided between the housing 27 and the movable door cover 214 to seal the connection between the two. The sealing element is disposed on one of the housing 27, the movable door cover 214, or both. The sealing element can be, for example, a rubber strip, an O-ring, a gel, or other devices suitable for sealing the interface module 23. In some embodiments, the dust particles around the load port 21 and/or the wafer carrier 10 may come from these sealing elements. The gas blowing system 240 may continuously generate a steady gas flow 249 toward the wafer carrier 10 and/or the load port 21 (see FIG. 6C) to prevent dust particles from rising. Thereby, it is possible to prevent the wafer W1 in the wafer carrier 10 from being contaminated by dust particles flow around the load port 21. In some embodiments, before opening the movable door cover 214, the strength of the fan filter 241 can be adjusted according to the gas pressure state around the wafer carrier 10 detected by the gas pressure detector 243 so that the gas pressure state can reach a predetermined state. At this time, the gas flow 249 passes through the airflow adjusting element 250 and results in a gas flow distributed around the wafer carrier 10. In some embodiments, the gas blowing system 240 can be interchangeably referred to as a gas downward blowing system, and the housing 246 of the gas blowing system 240 can be interchangeably referred to as an upper cover.

In FIGS. 6A and 6B, the exposure apparatus 4 may further include a signal tower 242 installed on the housing 27 of the interface module 23 and exhibiting an operation status of the lithography exposure apparatus. The signal tower 242 may include a light indicator 242*a* and a buzzer 242*b*. The light indicator 242*a* can display different colors (e.g., red, yellow, green) to indicate different apparatus status (e.g. alarm status, warning status, normal status). When the light indicator 242*a* indicates an abnormal apparatus status (e.g. alarm status, warning status), the buzzer 242*b* of the signal tower 242 will be triggered to alert the staff. In some embodiments, the exposure apparatus 4 may further include press buttons 248 on the interface module 23 to provide the functions including starting or stopping the operation of the exposure apparatus 4. When the press button 248 of starting operation is pressed, the exposure apparatus 4 can automatically read the cassette identification (ID) of the wafer carrier 10 on the load port 21 and communicate to a server to receive the process job corresponding to the wafers W1 in the read wafer carrier 10. Subsequently, the exposure apparatus 4 can process the wafer W1 in accordance with the received process job.

In FIG. 6B, the vacuum vessel 28 of the exposure apparatus 4 can be provided with a frame 101 which supports in that order, as seen parallel to a vertical Z-direction, a positioning device 103 according to the disclosure, a focusing unit 105, a mask holder 107, and a radiation source 109 therein. The positioning device 103 may include a first wafer stage 111, an identical second wafer stage 113, and a balancing unit 169. In some embodiments, the exposure apparatus 4 can be a dual-wafer-stage lithography tool. The exposure apparatus 4 may be an optical exposure apparatus 4 whose radiation source 109 includes a light source 115. The wafer stages 111 and 113 can include support surfaces 117 which extend perpendicularly to the Z-direction and on which a first one and a second one of the wafers W1 can be placed, respectively. The first wafer stage 111 is displaceable relative to the frame 101 parallel to an X-direction perpendicular to the Z-direction and parallel to a Y-direction perpendicular to the X-direction and perpendicular to the Z-direction by means of a first displacement unit 125 of the positioning device 103, while the second wafer stage 113 is displaceable relative to the frame 101 parallel to the X-direction and parallel to the Y-direction by means of a second displacement unit 127 of the positioning device 103. The first and second displacement units 125 and 127 are fastened to the balancing unit 169. The balancing unit 169 of the positioning device 103 mentioned above comprises a comparatively heavy balancing block made from, for example, granite. The focusing unit 105 is an imaging or projection system and comprises an optical lens system 129 with an optical main axis 131 directed parallel to the Z-direction. The mask holder 107 may include a support surface 133 which extends perpendicularly to the Z-direction and on which a mask 135 can be placed. The mask 135 may include a pattern or a sub-pattern of an integrated semiconductor circuit.

Figure 6C:
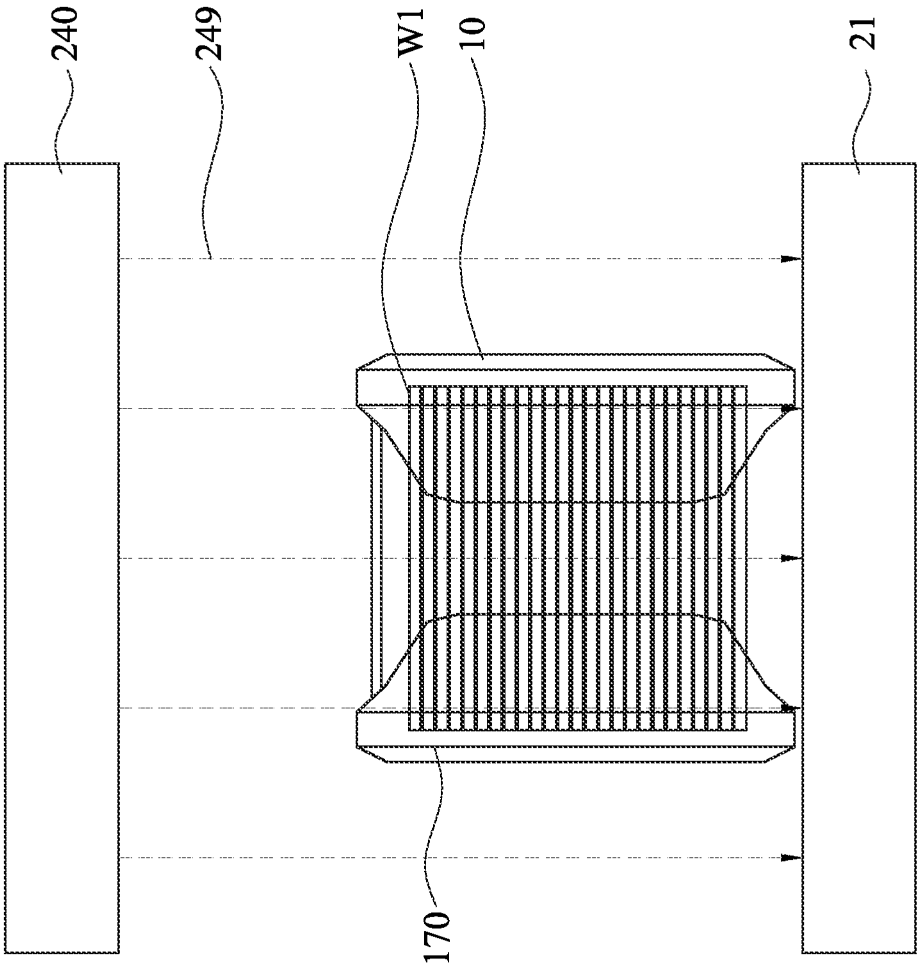
FIG. 6C shows a schematic perspective view of a wafer carrier with a plurality of wafers in accordance with some embodiments of the present disclosure.
Figure 6D:
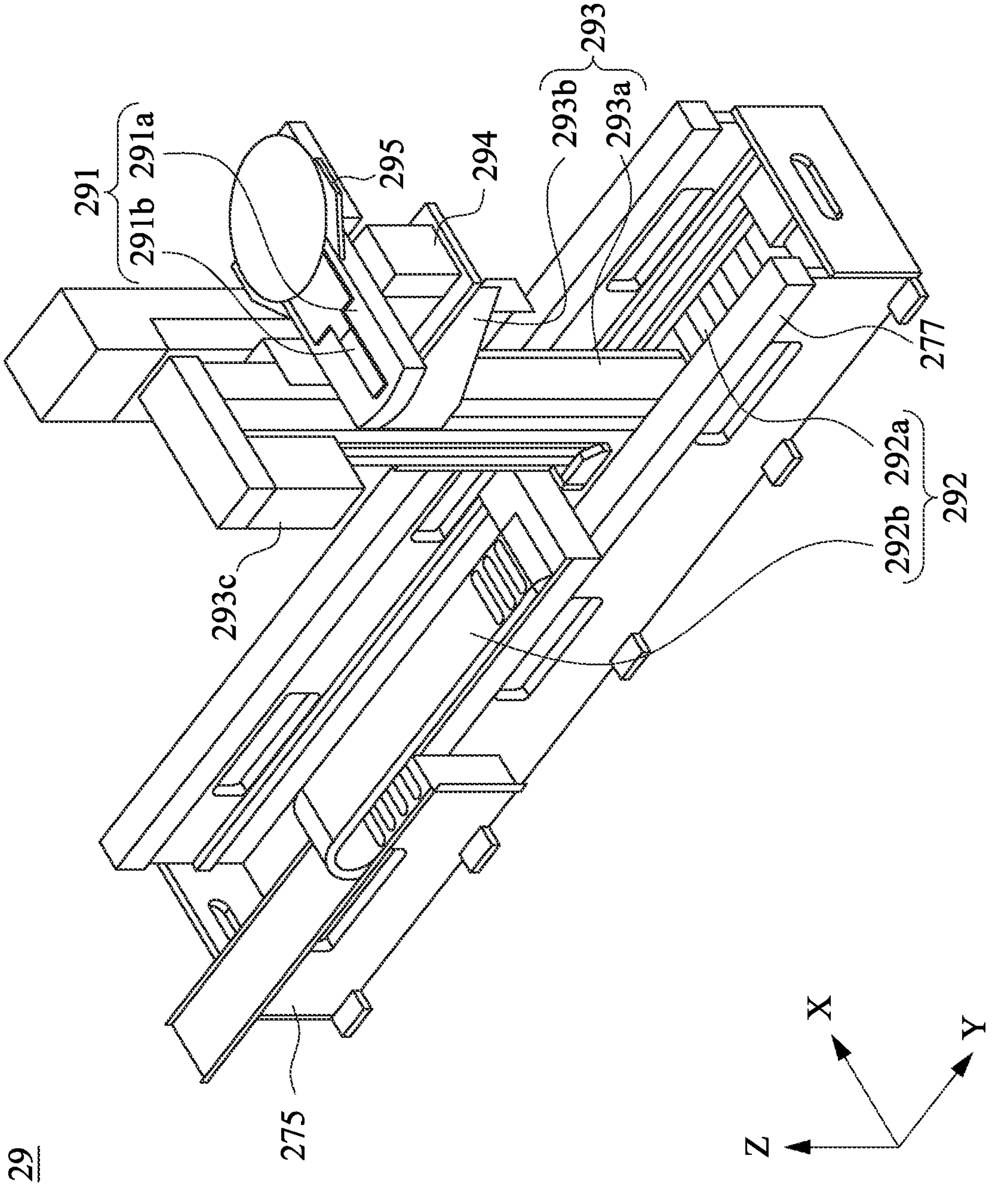
FIGS. 6D and 6E show schematic perspective views of a transferring module in an interface module of a lithography exposure apparatus in accordance with some embodiments of the present disclosure.
Figure 6E:
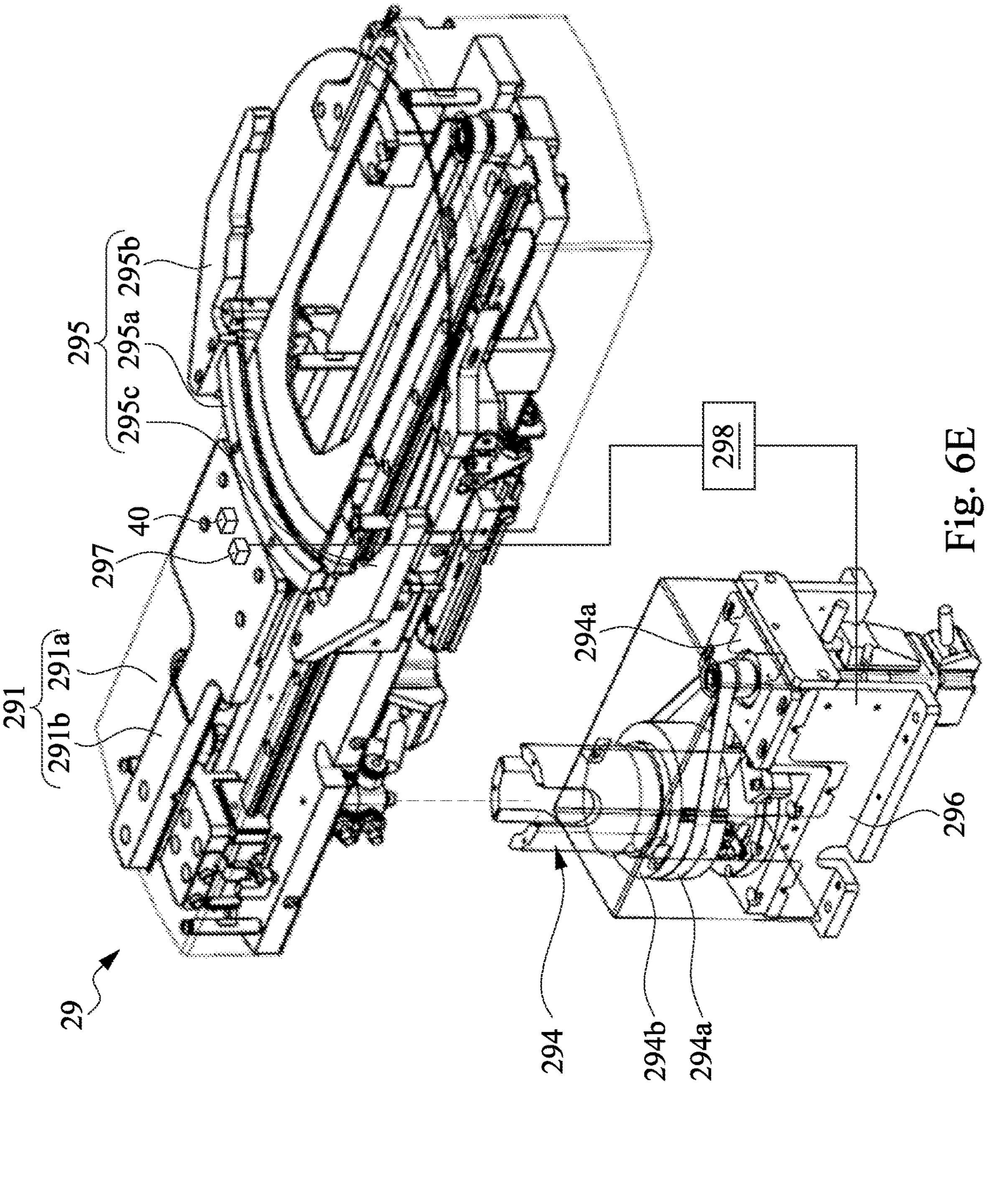

Reference is made to FIGS. 6D and 6E. FIGS. 6D and 6E illustrate schematic perspective views of the transfer module 29 installed in the housing 27 of the interface module 23 of the exposure apparatus 4 as shown in FIG. 6B in accordance with some embodiments of the present disclosure. The transfer module 29 is configured for physically transporting the wafer W1. For example, the transfer module 29 may retrieve the wafer W1 from the wafer carrier 10 to the housing 27. The wafer W1 can be transferred between the wafer carrier 10 and the vacuum vessel 28 through the door openings 27A and 27B, and then a robotic arm (not shown) in the vacuum vessel 28 may transfer the wafer W1 to the wafer stage 111 or the wafer stage 113 in the vacuum vessel 28. However, the locations where the transfer module 29 may transport the wafer W1 are not limited by the present embodiment. In some embodiments, the transfer module 29 can be interchangeably referred to as a robotic arm. In some embodiments, the transfer module 29 may include a wafer gripper 295 and a plurality of moving assemblies including a linear actuator 291, a railway 292, a lifter 293, and a rotor 294. The wafer gripper 295 can be formed in any shape and size according to need. In some embodiments, the wafer gripper 295 may have a U-shape configuration from a top view. As shown in FIG. 6E, the wafer gripper 295 can include a base portion 295*a*, a first finger 295*b*, and a second finger 295*c*. The first finger 295*b* and the second finger 295*c* extend outward from the base portion 295*a* to form the U-shaped profile to hold the wafer W1. The linear actuator 291 may include a horizontal slide rail 291*a*, a carrier 291*b* movably mounted on the horizontal slide rail 291*a*, and an actuator (not shown). The lifter 293 may include a vertical slide rail 293*a*, a carrier 293*b* movably mounted on the vertical slide rail 293*a*, and an actuator 293*c*. The railway 292 may include a horizontal slide rail 292*a* and an actuator 292*b*. The horizontal slide rail 292*a* of the railway 292 extends along an arrangement direction of the load ports 21 (FIG. 6A). In some embodiments, the rotor 294 is configured to control a rotation movement of the transfer module 29 and may include a theta axis that includes a motor 294*a*, a pulley 294*b*, and a belt 294*c* (see FIG. 6E). In some embodiments, a movement of the wafer gripper 295 can be driven by the linear motor 294*a* that can provide a torque greater than about 0.64 Nm to achieve a high speed movement for the transfer module 29.

The linear actuator 291, the second direction moving assembly 292, the lifter 293, and the rotor 294, may be independently controlled respectively, and can be activated in a moderate acceleration and deceleration during the movement thereof to prevent a position shift of the wafer W1 on the wafer gripper 295. In some embodiments, the horizontal slide rail 292*a* of the railway 292 may be connected to the vertical slide rail 293*a* of the lifter 293 by suitable connection means. For example, the vertical slide rail 293*a* of the lifter 293 can be movably coupled to the horizontal slide rail 292*a* of the railway 292, and the wafer gripper 295 is mounted on the carrier 293*b* of the lifter 293. Thereby, the slide rail 292*a* can guide the wafer gripper 295 in the Y direction when the transfer module 29 transfers the wafer among different load ports 21 in the exposure apparatus 4. In some embodiments, the actuator 292*b* of the second direction moving assembly 292 may comprise a track or other suitable actuator, and the actuator 292*b* (e.g., the track) is configured to move the horizontal slide rail 292*a* in the direction Y. The vertical slide rail 293*a* of the lifter 293 may be connected to the rotor 294 through the carrier 293*b*, and the wafer gripper 295 is mounted on the rotor 294. As with the railway 292, the linear actuator 291 and the wafer gripper 295 mounted on the rotor 294 can move along the vertical slide rail 293*a* in Z-direction. That is, the rotor 294 can be liftable by the lifter 293. The rotor 294 may be connected to the carrier 291*b* of the linear actuator 291 through the horizontal slide rail 291*a*, and the wafer gripper 295 is mounted on the carrier 291*b*. The linear actuator 291 can be rotatable by the rotor 294 and movable along a direction perpendicular to the lengthwise direction of the railway 292. As with the railway 292, the wafer gripper 295 mounted on the linear actuator 291 can be rotated on a horizontal plane relative to the lifter 293 and have different orientations. The horizontal slide rail 291*a* of the linear actuator 291 may be connected to the wafer gripper 295 through the carrier 291*b*. As with the railway 292, the wafer gripper 295 can have a linear movement, such as in X-direction. In some embodiments, the slide rails 292*a*, 293*a*, and 295*a* can reduce a vibration interference resulting from the movement of different directions in the transfer module 29. In some embodiments, the transfer module 29 may further include cables to transmit electrical signals communicated among the moving assemblies, and the cables are protected in cable guiders 277 made of a low friction material (e.g., Telfon) to reduce the friction between the cables and the moving assemblies during the movement of the moving assemblies. In some embodiments, the transfer module 29 may further include an out cover 275 enclosing the linear actuator 291 to eliminate a vibration in the interface module 23 due to the movement of the moving assemblies.

Therefore, the transfer module 29 can achieve a three-dimensional movement and an omnidirectional movement, which in turn allows for having four degrees of freedom. In some embodiments, the configurations of the linear actuator 291, the railway 292, the lifter 293, the rotor 294, and the wafer gripper 295 are only examples, and are not intended to limit the scope of the present disclosure. In some other embodiments, the linear actuator 291, the railway 292, the lifter 293, and the rotor 294 may adopt other suitable configurations, and are not limited to the configurations described herein. In some embodiments, the linear actuator 291 can be interchangeably referred to as a first horizontal moving assembly, the railway 292 can be interchangeably referred to as a second horizontal moving assembly, the lifter 293 can be interchangeably referred to as a vertical moving assembly. In some embodiments, the horizontal slide rail 292*a* can be interchangeably referred to a railway, and the wafer gripper 295 can be interchangeably referred to as a robot, a gripper, or a blade.

As shown in FIG. 6E, the transfer module 29 may further include a cooling system 296 disposed underneath the pulley 294*b* of the rotor 294. In some embodiments, the cooling system 296 may be configured to cool the wafer gripper 295 so as to eliminate the temperature effect on the wafer W1 disposed on the wafer gripper 295. In some embodiments, the cooling system 296 may be a fan unit. In some embodiments, a temperature detector 297 may be disposed on the wafer gripper 295 to detect the temperature on the wafer gripper 295 and be electrically connected to a control unit 298. Before gripping the wafer W1, the control unit 298 may be configured to determine whether a temperature of the wafer gripper 295 reaches a predetermined temperature. If the temperature of the wafer gripper 295 reaches the predetermined temperature, the control unit 298 will adjust the strength of the cooling system 296 according to the temperature around the wafer gripper 295 detected by the temperature detector 297, such that the temperature on the wafer gripper 295 can be lowered to reach a predetermined state, which in turn eliminates the temperature effect on the wafer W1. In some embodiments, the control unit 298 may perform an aerodynamics simulation to simulate a state of gas flow driven by the cooling system 296 with the adjusted strength, so as to determine whether the state of gas flow disturbs particles to contaminate the wafer W1 disposed on the wafer gripper 295. If the state of the gas flow will disturb the particles to contaminate the wafer W1 disposed on the wafer gripper 295, the control unit 298 may lower the strength of the cooling system 296 according to a result of the aerodynamics simulation.

Figure 6F:
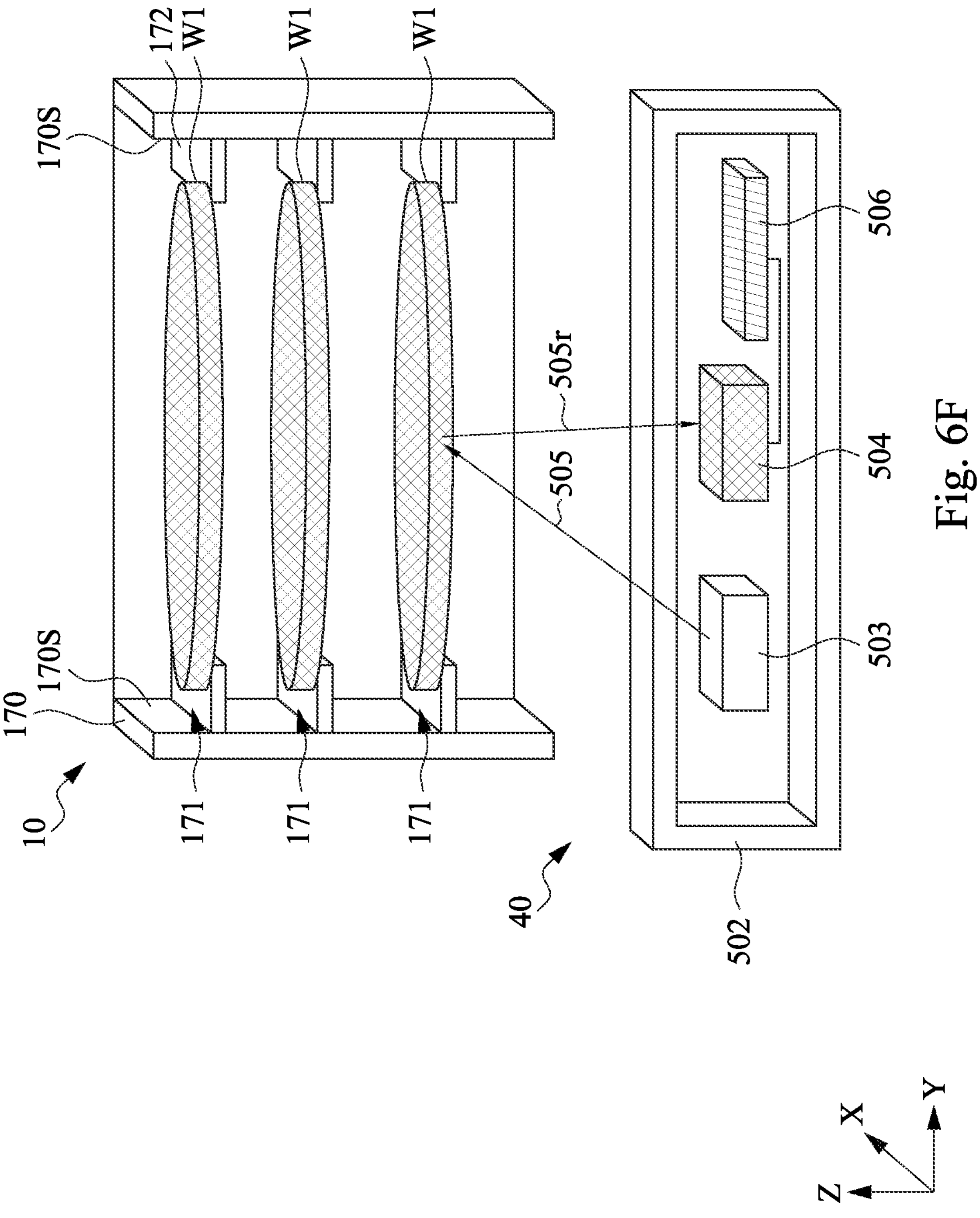
FIGS. 6F and 6G shows schematic perspective and cross-sectional views illustrating a method for mapping wafers in a wafer carrier by using a metrology mounted on a transferring module in accordance with some embodiments of the present disclosure.
Figure 6G:
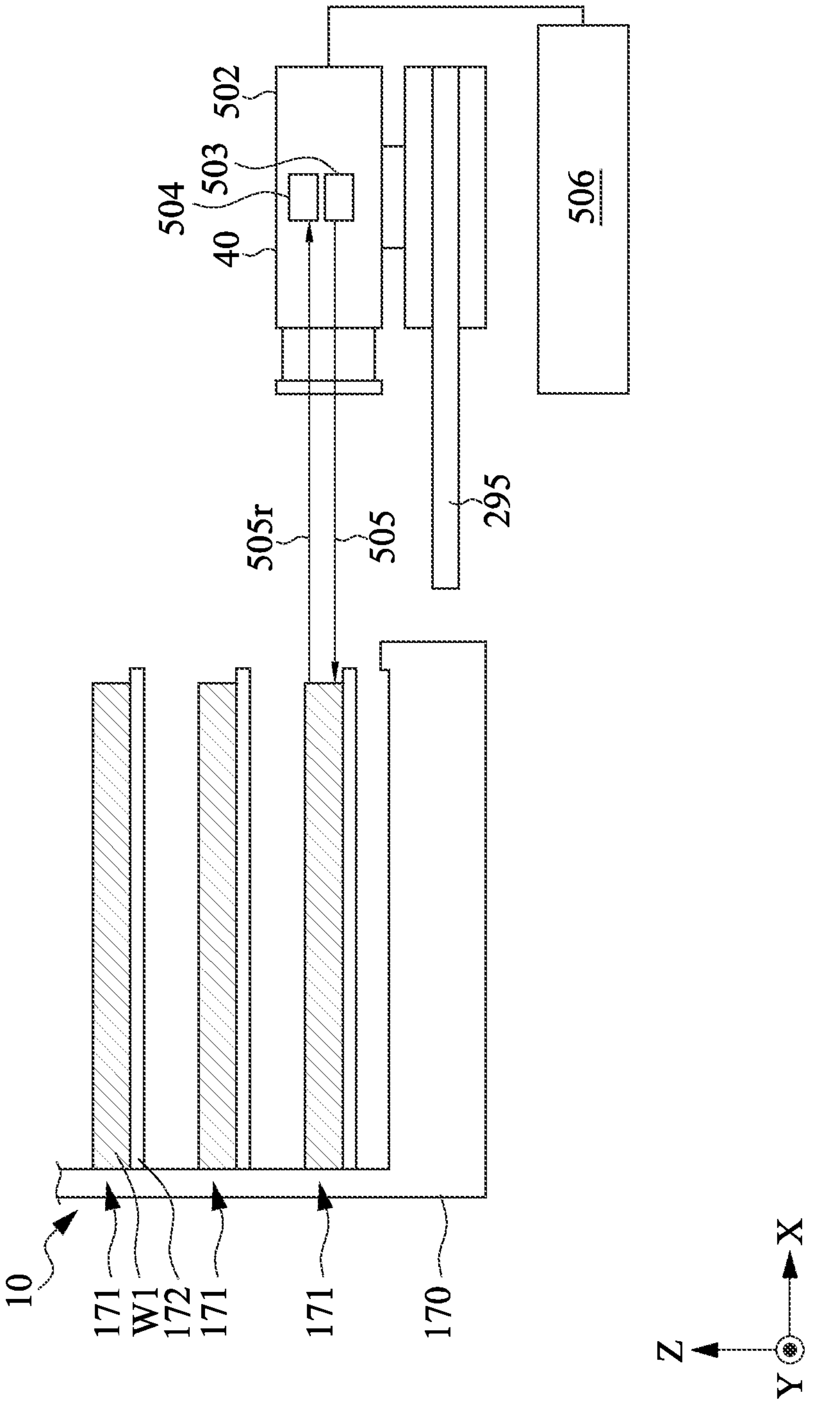
Figure 6H:
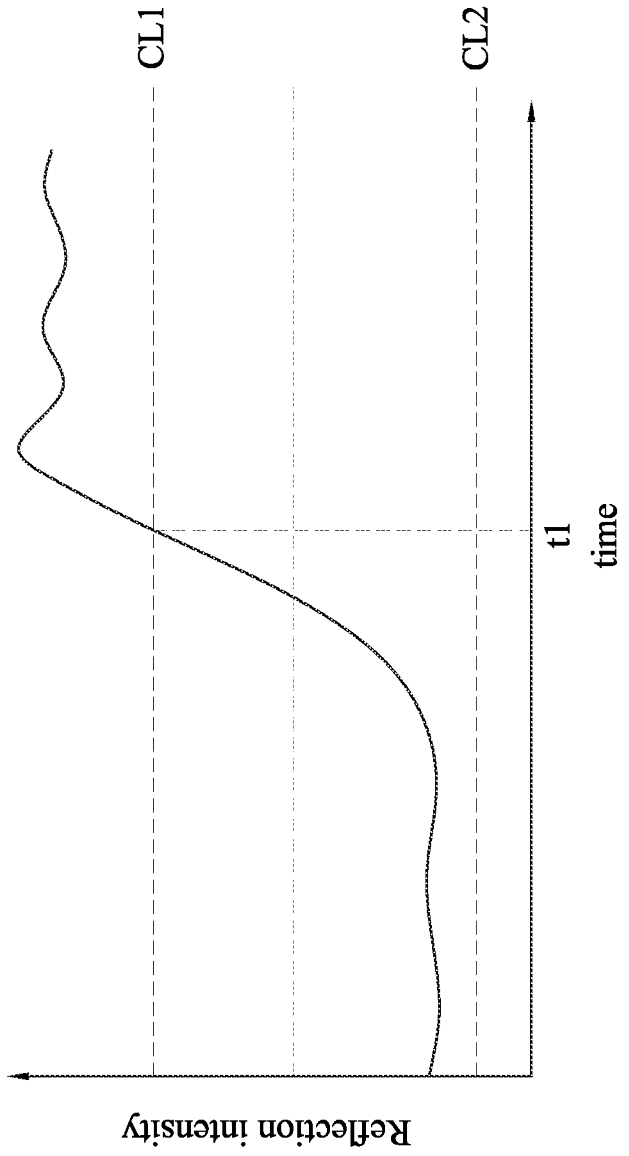
FIG. 6H is a diagram plotting measured reflection intensity on a wafer carrier versus time with a metrology in accordance with some embodiments of the present disclosure.
Figure 6I:
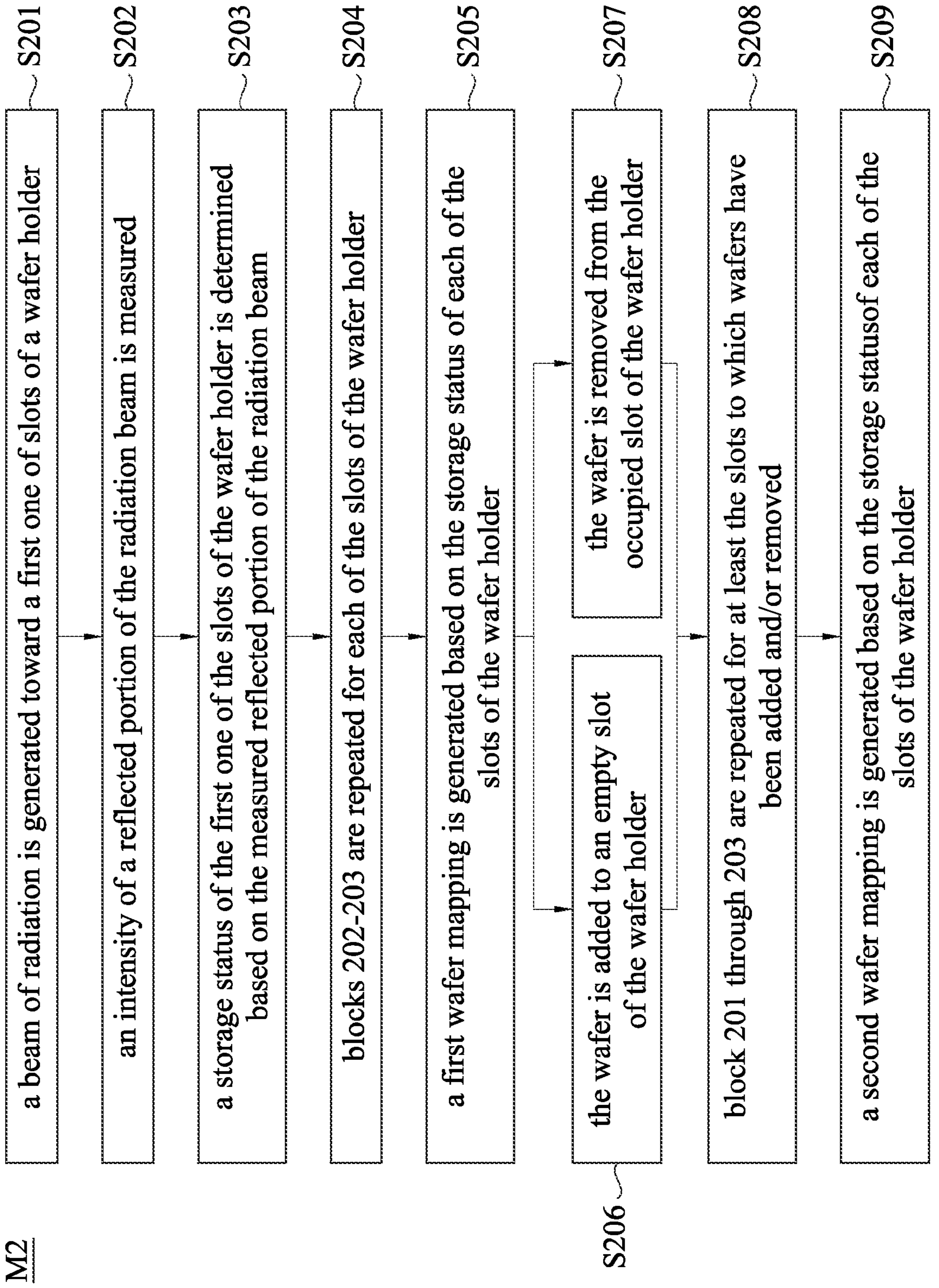
FIG. 6I is a flowchart illustrating a method for mapping wafers in accordance with some embodiments of the present disclosure.

Reference is made to FIGS. 6F-6I. FIGS. 6F and 6G show schematic perspective and cross-sectional views illustrating a method for mapping wafers W1 in the wafer carrier 10 by using a metrology device 40 mounted on the wafer gripper 295 in accordance with some embodiments of the present disclosure. FIG. 6H is a diagram plotting measured reflection intensity on the wafer carrier 10 versus time with the metrology device 40 in accordance with some embodiments of the present disclosure. FIG. 6I is a flowchart illustrating a method for mapping wafers W1 in the wafer carrier 10 in accordance with some embodiments of the present disclosure. As shown in FIG. 6F, the wafer carrier 10 may include a housing 170 and a plurality of slots 171 on opposite inner sidewalls 170S of the housing 170. In some embodiments, each of the slots 171 of the wafer carrier 10 includes one or more shelves (shelves) 172. The slots 171 are vertically stacked along the Z-direction. Each of the slots 171 is configured to receive a wafer W1. In some embodiments, the shelves 172 can be interchangeably referred to as jigs. The slot 171 has an opening on one side of the wafer carrier 10 so that the wafer W1 can be moved into the slot 171 and/or out of the slot 171 along the X-direction.

As shown in FIGS. 6F and 6G, the metrology device 40 is mounted on the wafer gripper 295 (see FIG. 6G) to scan the slots 171 of the wafer carrier 10 to determine which slots 171 are occupied by the wafer W1 and which are empty. When loading or unloading wafers W1 from the wafer carrier 10, the metrology device 40 on the wafer gripper 295 may be informed which slots 171 have wafers W1 and which slots 171 are not (i.e., empty). For example, when a wafer W1 is removed from a wafer carrier 10, the metrology device 40 on the wafer gripper 295 may be informed which slots 171 having the wafer W1 therein so that the wafer gripper 295 can select the correct wafer W1 on the right position. Further, when loading the wafers W1 into the wafer carrier 10, the metrology device 40 on the wafer gripper 295 may be informed which slots 171 are empty to avoid attempting to load wafers W1 into an already occupied slot 171. In some instances, if the wafer gripper 295 does not sense which slots 171 contain wafers W1, the wafer gripper 295 may attempt to load the wafers W1 into the occupied slots 171, which may cause a wafer contact, which in turn results in a wafer damage. Further, if the wafer gripper 295 does not sense which slots 171 contain wafers W1, the wafer gripper 295 may attempt to remove wafers W1 from empty slots 171, which in turn wastes time and/or resources of a manufacturing process.

In some embodiments, the wafer gripper 295 is configured to vertically move the metrology device 40 in an upward direction and in a downward direction along the Z-direction and/or horizontally move the metrology device 40 along the Y-direction. In some embodiments, the metrology device 40 can be a light intensity sensor. In some embodiments, the metrology device 40 can be interchangeably referred to as a wafer mapping sensor or a wafer-mapping metrology device. In some embodiments, the metrology device 40 includes a housing 502 disposed on the wafer gripper 295, a light emitting unit 503 disposed within the housing 502, a light receiving unit 504 disposed within the housing 502 and adjacent to the light emitting unit 503, and a sensor control circuitry 106. In some embodiments, the light emitting unit 503 is configured to generate (i.e., emit) a beam 505 toward one or more slots 171 of the wafer carrier 10. For example, the light emitting unit 503 generates the beam 505 toward a first one of the slots 171 of the wafer carrier 10. In some embodiments, the light emitting unit 503 can be a laser or some other suitable radiation source. In some embodiments, the beam 505 can be an electromagnetic radiation or a laser beam. The light receiving unit 504 is configured to measure the intensity of the reflected portion 505*r* of the beam 505 that is reflected back toward the light receiving unit 504 from the wafer carrier 10 and/or the wafer W1 in the wafer carrier 10. For example, since the first one of the slots 171 receives the wafer W1, the light receiving unit 504 measures the reflected portion 505*r* of the beam 505 that is reflected from the wafer W1 in the first one of the slots 171. In some embodiments, the light receiving unit 504 can be interchangeably referred to as a detect sensor or a light intensity sensor. In some embodiments, the light receiving unit 504 may be a light-sensitive device, such as a phototransistor, a photodiode, an optical fiber pressure sensor or other suitable components.

In some embodiments, the sensor control circuitry 506 is coupled to the light receiving unit 504. By detecting the light intensity of the optical signal from the wafer carrier 10, the sensor control circuitry 506 can determine whether the slot 171 is empty or occupied by the wafer W1. For example, if a first one the slots 171 is occupied by the wafer W1, the light receive unit 504 may receive the optical signal from the wafer W1, not the wafer carrier 10, and detect the light intensity of the optical signal of the wafer W1. Therefore, the optical signal from the wafer W1 may be approached a reference optical signal, such that the sensor control circuitry 506 can determine a light intensity difference between the reflected portion 505*r* of the beam 505 and the reference optical signal that is within a range of acceptable values, and then a storage status of the wafer carrier 10 will be indicated as occupied. Specifically, before analyzing the detected data in T-chart shown in FIG. 6H associated with the storage status of the wafer carrier 10, a range of acceptable values for the measured storage status is determined. For example, as shown in FIG. 6H, first and second control limits CL1 and CL2 are set. A range above the first control limit CL1 (i.e., empty) and lower the second control limit CL2 (i.e., occupied) at a specific time is referred to as the range of acceptable values. In some embodiments, the range of acceptable values is determined by the position where the wafer W1 is located, because the expected storage status varies accordingly. After the range of acceptable values for the measured storage status is determined, the FDC system 50 (see FIG. 1) analyzes the measured storage status to determine if the measured storage status is within the acceptable range. After the analysis, if the measured storage status is within the range of acceptable values, the method repeats measuring storage status and determining whether the measured storage status is within a range of acceptable value until the predetermined period for monitoring the wafer carrier 10 is finished. However, if the measured storage status exceeds the range of acceptable values, an alarm condition will be indicated. Therefore, the sensor control circuitry 506 can generates a wafer mapping result that lists which slots 171 are occupied by the wafers W1 and which slots 171 are empty, which in turn maps the positions of the wafer W1 in the wafer carrier 10. In addition, the sensor control circuitry 506 is configured to determine whether the storage status of the slots 171 in the cassette is acceptable. If the storage status of the slots 171 in the cassette is non-acceptable, the sensor control circuitry 506 will issue a warning to inform the transfer module 29.

The method M2 shown in FIG. 6I includes a relevant part of the method for mapping wafers W1 in the wafer carrier 10. The method M2 may be implemented, in whole or in part, by a system employing deep ultraviolet (DUV) lithography, extreme ultraviolet (EUV) lithography, electron beam (e-beam) lithography, x-ray lithography, and other appropriate lithography processes to improve pattern dimension accuracy. Additional operations can be provided before, during, and after the method M2, and some operations described can be replaced, eliminated, modified, moved around, or relocated for additional embodiments of the method. One of ordinary skill in the art may recognize other examples of semiconductor fabrication processes that may benefit from aspects of the present disclosure. The method M2 is an example, and is not intended to limit the present disclosure beyond what is explicitly recited in the claims.

The method M2 begins at block S201 where a beam of radiation is generated toward a first one of slots of a wafer carrier. The method M2 then proceeds to block S202 where an intensity of a reflected portion of the radiation beam is measured. The method M2 then proceeds to block S203 where a storage status of the first one of the slots of the wafer carrier (e.g., whether the first one of the slots is occupied by a wafer or empty) is determined based on the measured reflected portion of the radiation beam. The method M2 then proceeds to block S204 where blocks 202-203 are repeated for each of the slots of the wafer carrier. The method M2 then proceeds to block S205 where a first wafer mapping is generated based on the storage status (e.g., occupied or empty) of each of the slots of the wafer carrier. In some embodiments, one of block 206 and block 207 may be performed in method M2. In some embodiments, both of block 206 and block 207 are performed in method M2. The method M2 then proceeds to block S206 where the wafer is added to an empty slot of the wafer carrier. The method M2 then proceeds to block S207 where the wafer is removed from the occupied slot of the wafer carrier. The method M2 then proceeds to block S208 where block 201 through 203 are repeated for at least the slots to which wafers have been added and/or removed. In some embodiments, blocks 201-203 are repeated for each of the slots of the wafer carrier. The method M2 then proceeds to block S209 where a second wafer mapping is generated based on the storage status (e.g., occupied or empty) of each of the slots of the wafer carrier.

In some embodiments, the exposure apparatus 4 may further include a user interface that can exhibit a communication status, a wafer status, and/or an alarm status for the exposure apparatus 4. By way of example but not limiting the present disclosure, an abnormal mapping wafer and/or an abnormal processed wafer on the exposure apparatus 4 can be indicated as different color bars to be distinguished from others on the user interface. In some embodiments, the exposure apparatus 4 may further include a communication system that can detect and record a wafer information including how and where the wafers W1 are processed in the exposure apparatus 4, and then compare the wafer information with a reference information associated with the wafer W1 in real time. Therefore, the wafer information belonging to a wrong wafer transferring information caused by a machine signal loss or an operator mis-operation can be detected, which in turns prevents the wafer W1 from going through a wrong manufacturing process. In some embodiments, the exposure apparatus 4 may further include an alarm system that can exhibit an alarm information (e.g., wrong wafer transferring information) on the user interface to guide the operator to address the alarm issue.

Figure 7:
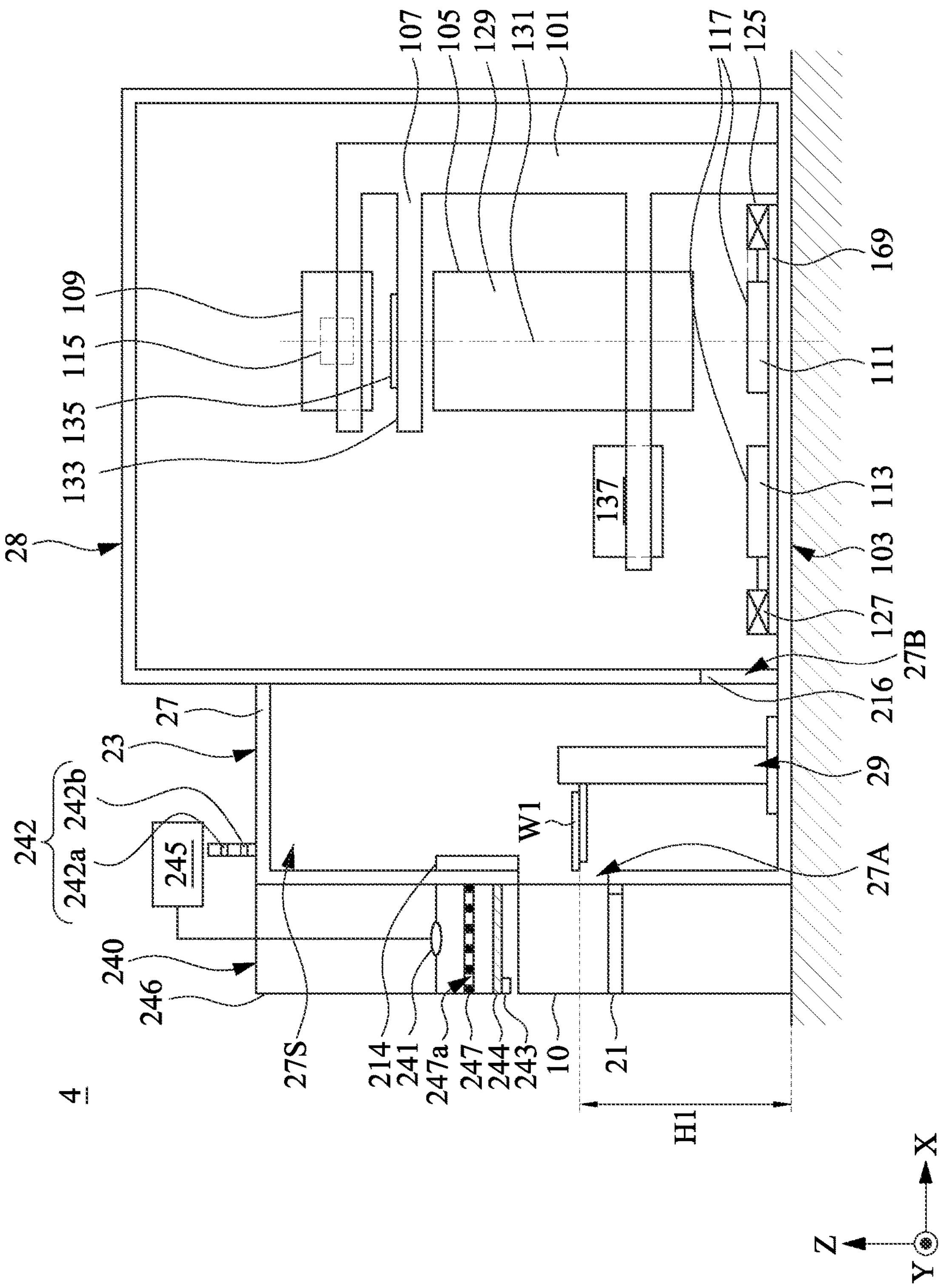
FIG. 7 shows a schematic cross-sectional view of one stage of a method for transporting a wafer in a lithography exposure apparatus as the wafer is positioned in an interface module and on a transferring module at a first level height in accordance with some embodiments of the present disclosure.

Reference is made to FIG. 7. FIG. 7 illustrates a schematic cross-sectional view of one stage of a method for transporting the wafer W1 in the exposure apparatus 4 as the wafer W1 is positioned in the interface module 23 and on the transfer module 29 at a first level height H1 in accordance with some embodiments of the present disclosure. To perform a lithography exposure process P2 (see FIG. 4D) on the wafer W1, the wafer carrier 10 which contains the wafer W1 is placed on the load port 21 of the exposure apparatus 4, as shown in FIG. 6C. After the wafer carrier 10 is placed on the load port 21, the wafer W1 is removed from the wafer carrier 10 by the transfer module 29 and moved toward the vacuum vessel 28 of the exposure apparatus 4.

Figure 8A:
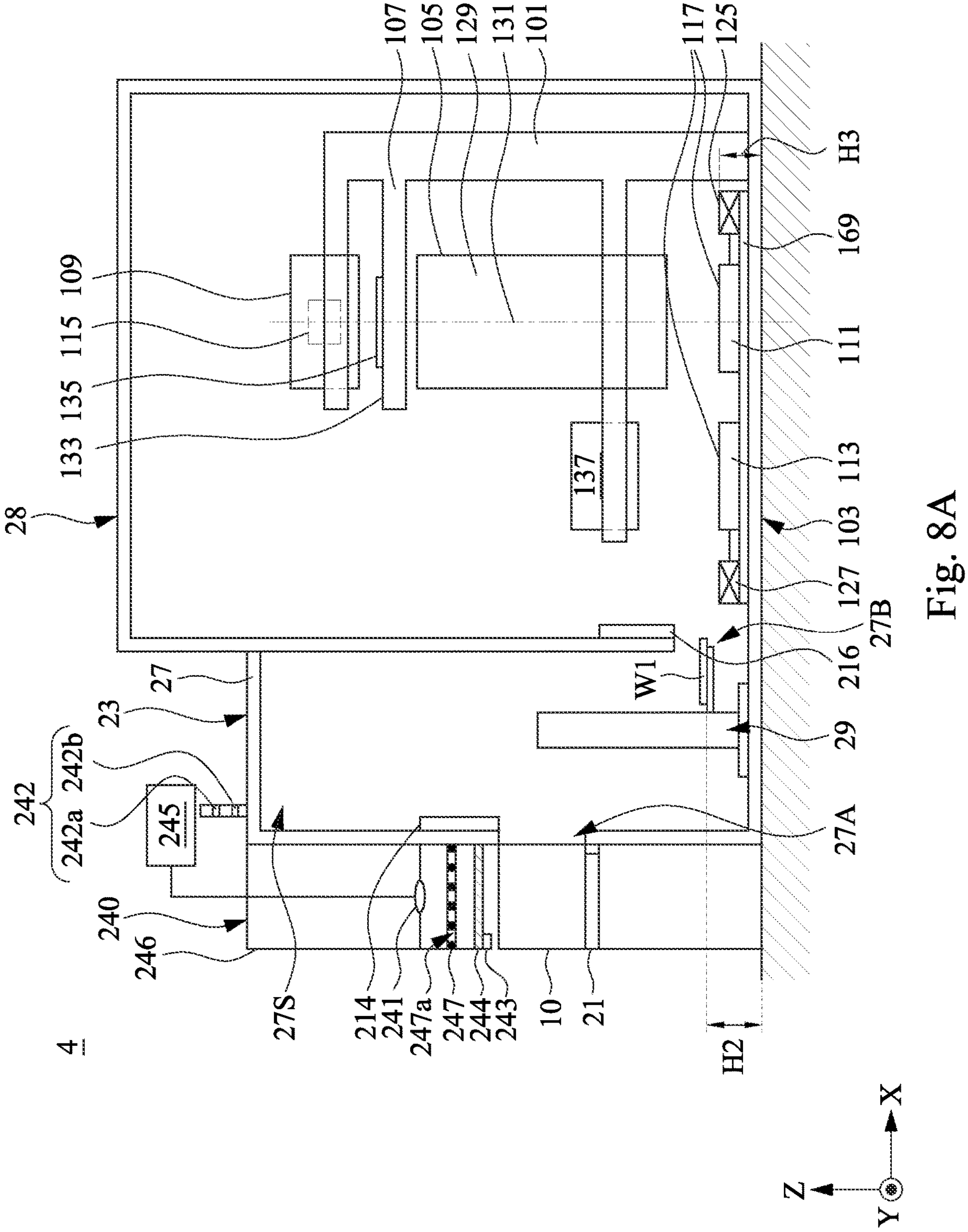
FIG. 8A shows a schematic cross-sectional view of one stage of a method for transporting a wafer in a lithography exposure apparatus as the wafer is positioned in an interface module and on a transferring module at a second level height in accordance with some embodiments of the present disclosure.
Figure 8B:
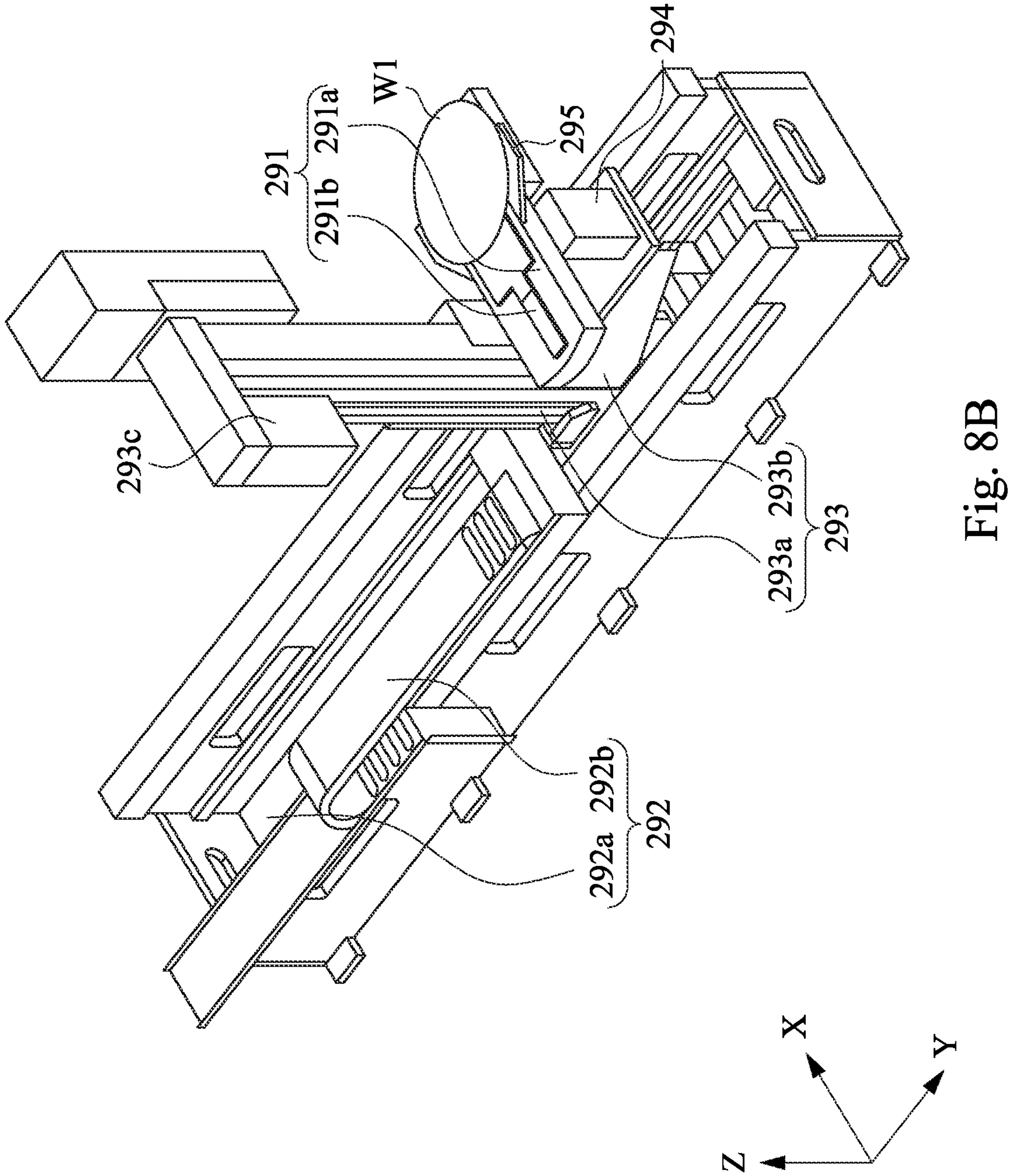
FIG. 8B shows a perspective view of the transferring module having the wafer thereon in FIG. 8A.

Reference is made to FIGS. 8A and 8B. FIG. 8A shows a schematic cross-sectional view of one stage of a method for transporting the wafer W1 in the exposure apparatus 4 as the wafer W1 is positioned in the interface module 23 and on the transfer module 29 at a second level height H2 in accordance with some embodiments of the present disclosure. FIG. 8B shows a perspective view of the transferring module having the wafer thereon in FIG. 8A. The second level height H2 shown in FIG. 8B is less than the first level height H1 shown in FIG. 7. In greater detail, a level height of the wafer W1 on the wafer gripper 295 is lowered to approach a height H3 of the wafer stage 111/113 of the exposure apparatus 4 by a vertical movement of the lifter 293 of the transfer module 29. By way of example but not limiting the present disclosure, the height H3 of the wafer stage 111/113 of the lithography exposure tool 4 may be in a range from about 100 mm to about 800 mm, such as about 100, 200, 300, 400, 500, 600, 700, or 800 mm.

Figure 9:
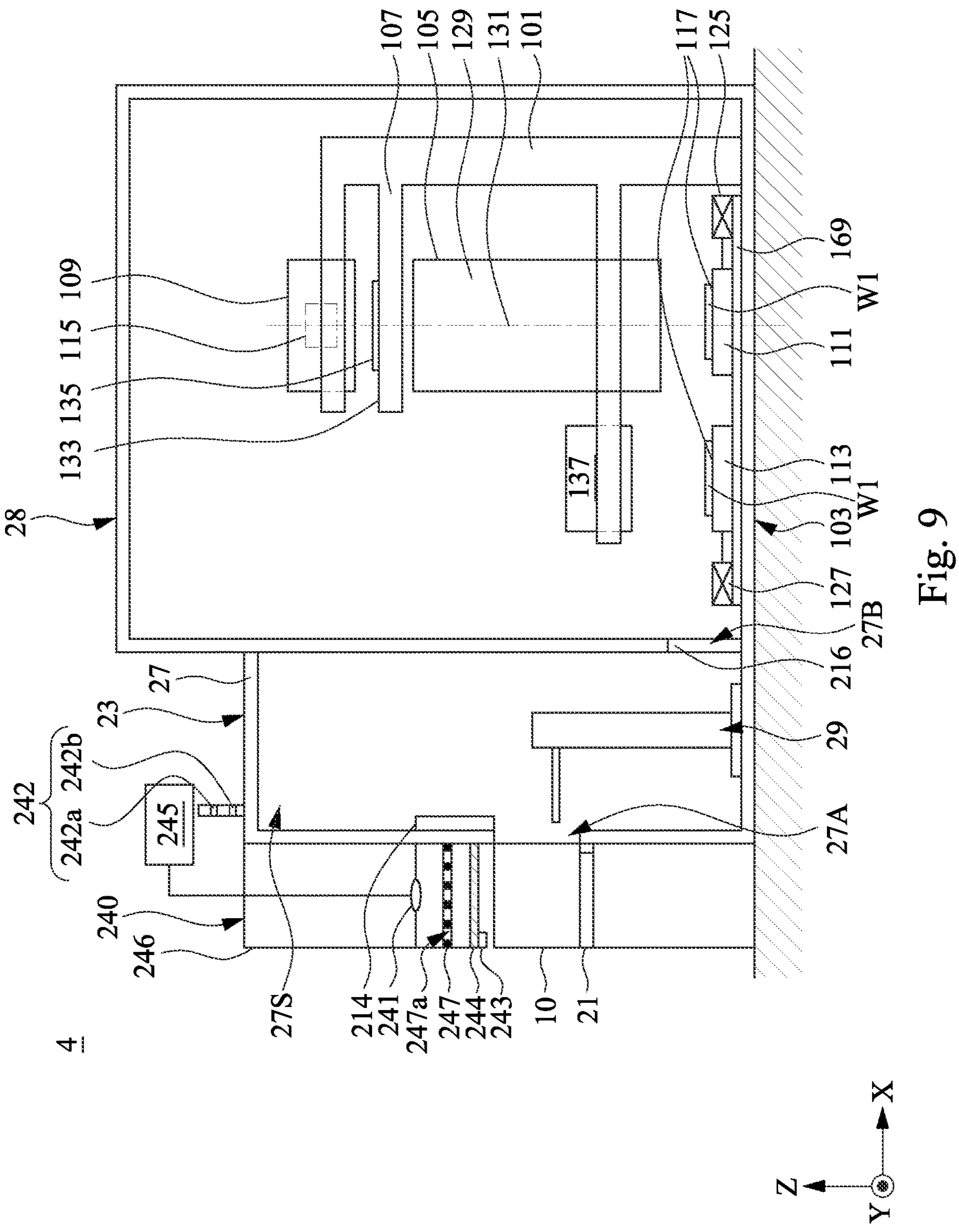
FIG. 9 shows a schematic cross-sectional view of one stage of a method for transporting a wafer in a lithography exposure apparatus as the wafer is positioned over a exposure stage in accordance with some embodiments of the present disclosure.

Reference is made to FIG. 9. FIG. 9 shows a schematic cross-sectional view of one stage of a method for transporting the wafer W1 in the exposure apparatus 4 as the wafer W1 is positioned over the exposure stage in accordance with some embodiments of the present disclosure. As shown in FIG. 9, the wafers W1 are transferred from the interface module 23 to the vacuum vessel 28, and then an exposing process P2 (see FIG. 4D) is performed on the wafers W1 that is disposed on the wafer stages 111 and 113.

This is described in greater detail with reference to FIG. 9, a light beam originating from the light source 115 is guided through the mask 135 and focused on the first one of the wafers W1 by means of the lens system 129, so that the pattern present on the mask 135 is imaged on a reduced scale on the first one of the wafers W1. The first one of the wafers W1 may include comprises a large number of individual fields on which identical semiconductor circuits are provided. The fields of the first one of the wafers W1 are consecutively exposed through the mask 135 for this purpose. During the exposure of an individual field of the first one of the wafers W1, the first one of the wafers W1 and the mask 135 are in fixed positions relative to the focusing unit 105, whereas after the exposure of an individual field a next field is brought into position relative to the focusing unit 105 each time in that the first wafer stage 111 is displaced parallel to the X-direction and/or parallel to the Y-direction by the first displacement unit 125. This process is repeated a number of times, with a different mask each time, so that complicated integrated semiconductor circuits with a layered structure are manufactured. The integrated semiconductor circuits to be manufactured by means of the exposure apparatus 4 have a structure with detail dimensions which lie in the sub-micron range. Since the first one of the wafers W1 is exposed consecutively through a number of different masks, the pattern present on these masks should be imaged on the first one of the wafers W1 with an accuracy which also lies in the sub-micron range, or even in the nanometer range. Therefore, the first one of the wafers W1 can be positioned relative to the focusing unit 105 with a comparable accuracy between two consecutive exposure steps, so that high requirements are imposed on the positioning accuracy of the positioning device 103.

A batch of wafers W1 under manufacture is consecutively exposed through the mask 135 in the exposure apparatus 4, whereupon said batch is consecutively exposed through a next mask. This process is repeated a number of times, each time with another mask. The wafers W1 to be exposed are present in a magazine from which the semiconductor substrates are transported consecutively into a measuring position of the positioning device 103 by means of a transport mechanism. The first wafer stage 111 is in an operational position in which the first one of the wafers W1 placed on the first wafer stage 111 can be irradiated by the radiation source 109 through the focusing unit 105. The second wafer stage 113 is in said measuring position of the positioning device 103, in which a position of the second one of the wafers W1 placed on the second wafer stage 113 relative to the second wafer stage 113 can be measured in directions parallel to the X-direction and parallel to the Y-direction by means of an optical position measuring unit 137 of the exposure apparatus 4, which unit is depicted diagrammatically only in FIG. 9, and in which the second one of the wafers W1 is positioned with respect to the second wafer stage 113 with a predetermined accuracy by means of said transport mechanism. The optical position measuring unit 137 is also fastened to the frame 101. After the exposure of the first one of the wafers W1 has been completed, the first wafer stage 111 is displaced by the positioning device 103 from the operational position into the measuring position, from whence the first one of the wafers W1 is returned to the magazine by said transport mechanism. Simultaneously, the second one of the wafers W1 is displaced from the measuring position into the operational position by the positioning device 103. Since the position of the second one of the wafers W1 relative to the second wafer stage 113 has already been measured in the measuring position and the second semiconductor substrate 123 has already been positioned relative to the second wafer stage 113 with a desired accuracy, a comparatively simple measurement of the position of the second wafer stage 113 relative to the frame 101 and the focusing unit 105 can suffice in the operational position. Measuring and positioning a wafer W1 relative to a exposure stage requires comparatively much time, so that the use of the positioning device 103 according to the disclosure with the two displacement units 125 and 127 achieves a considerable increase in the manufacturing output compared with a exposure apparatus 4 having only one exposure stage, where the alignment of the semiconductor substrate relative to the exposure stage takes place in the operational position.

Figure 10:
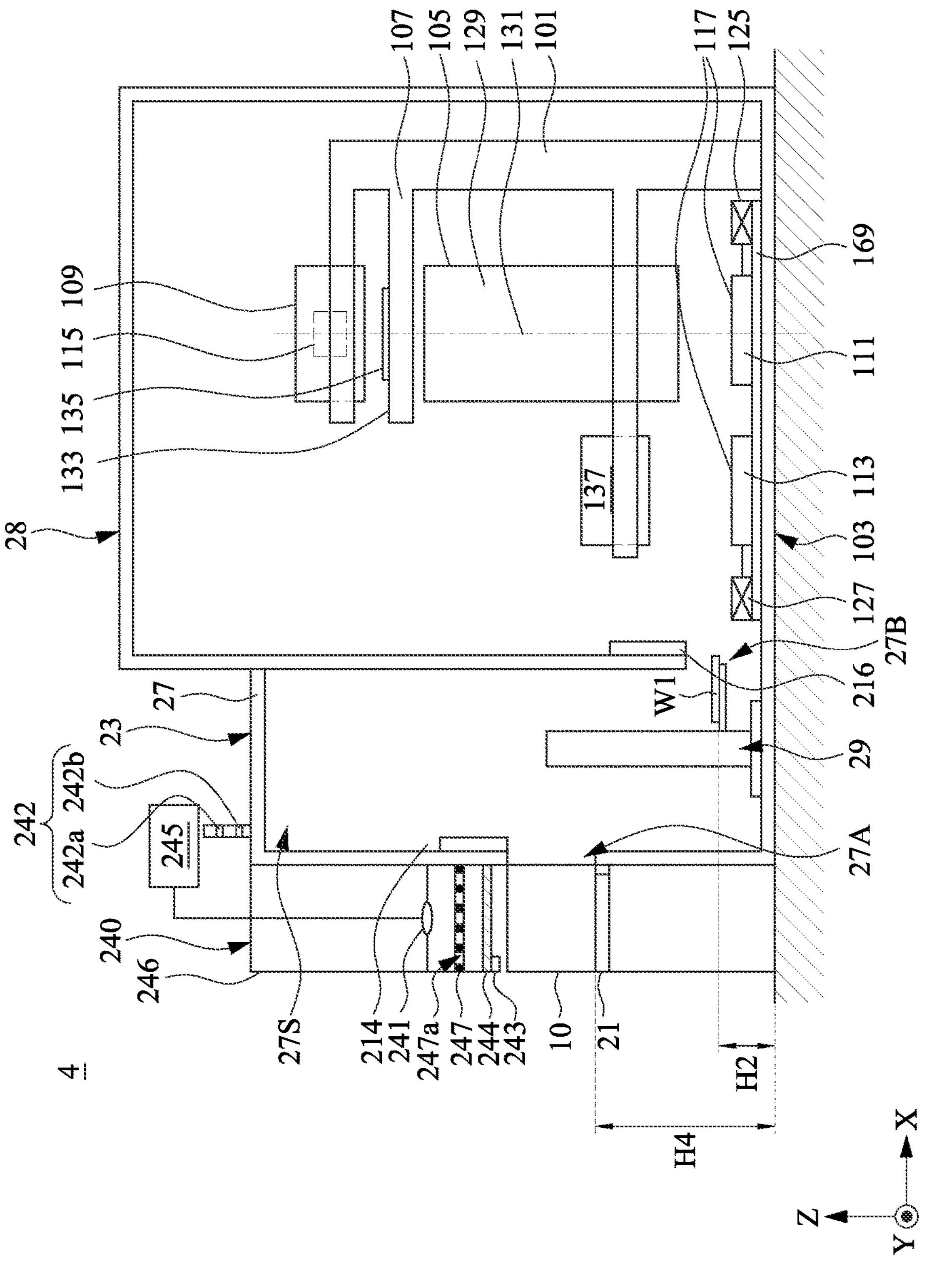
FIG. 10 shows a schematic cross-sectional view of one stage of a method for transporting a wafer in a lithography exposure apparatus as the wafer is positioned in a interface module and on a transferring module at the second level height in accordance with some embodiments of the present disclosure.

Reference is made to FIG. 10. FIG. 10 shows a schematic cross-sectional view of one stage of a method for transporting the wafer W1 in the exposure apparatus 4 as the wafer W1 is positioned in the interface module 23 and on the transfer module 29 at the second level height H2 in accordance with some embodiments of the present disclosure. After the exposing process P2 (see FIG. 4D) is complete, the wafer W1 is retrieved from the vacuum vessel 28 by the transfer module 29. As shown in FIG. 10, the wafer W1 is on the transfer module 29 and located in the second level height H2.

Figure 11:
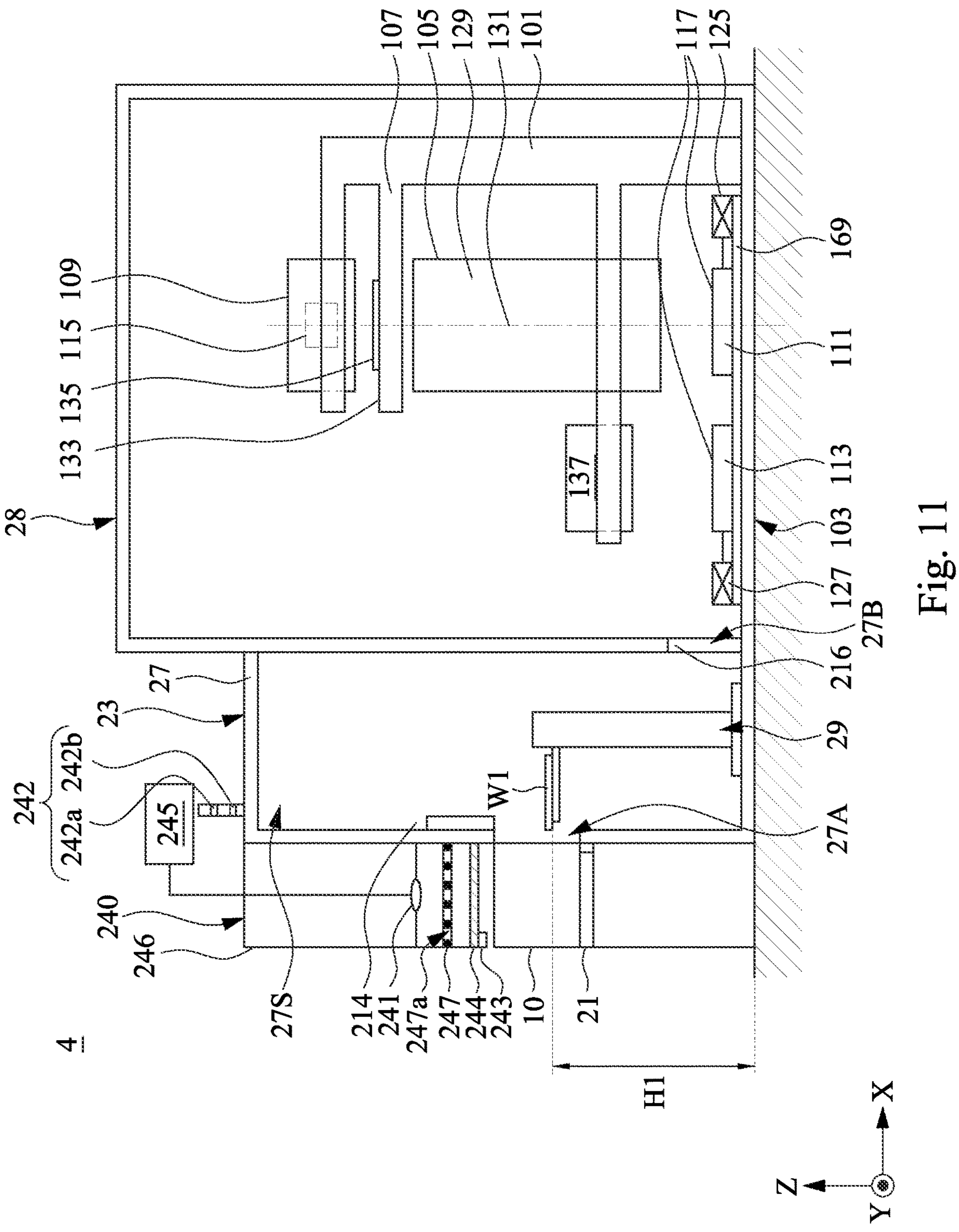
FIG. 11 shows a schematic cross-sectional view of one stage of a method for transporting a wafer in a lithography exposure apparatus as the wafer is positioned in a interface module and on a transferring module at the first level height in accordance with some embodiments of the present disclosure.

Reference is made to FIG. 11. FIG. 11 shows a schematic cross-sectional view of one stage of a method for transporting the wafer W1 in the exposure apparatus 4 as the wafer W1 is positioned in the interface module 23 and on the transfer module 29 at the first level height H1 in accordance with some embodiments of the present disclosure. A level height of the wafer W1 on the wafer gripper 295 is lifted to approach a height H4 of the load port 21 of the exposure apparatus 4 by a vertical movement of the lifter 293 of the transfer module 29. In some embodiments, the height H4 of the load port 21 of the exposure apparatus 4 is greater than the height H3 (see FIG. 8B) of the wafere stages 111 and 113 of the exposure apparatus 4.

Figure 12:
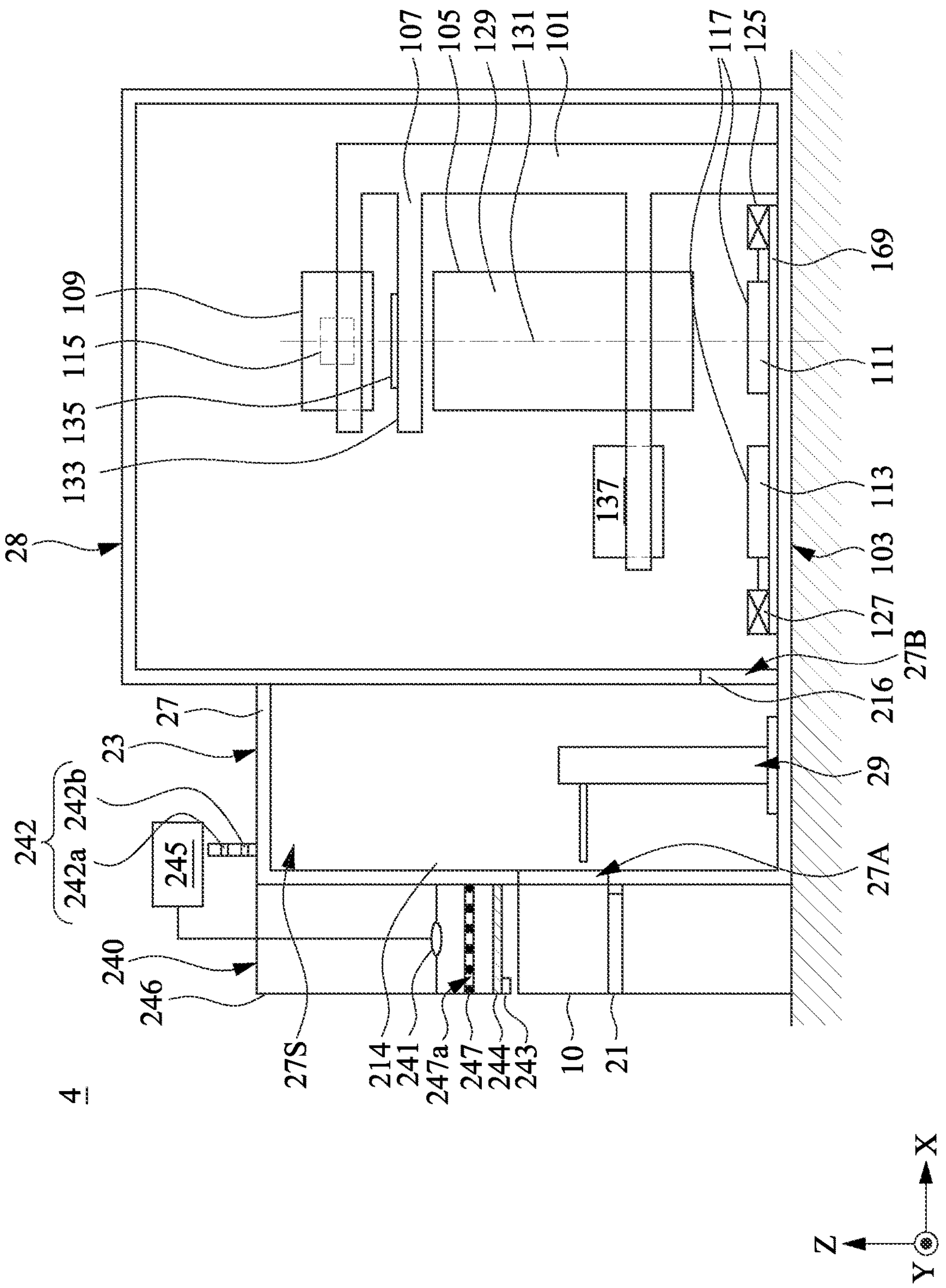
FIG. 12 shows a schematic cross-sectional view of one stage of a method for transporting a wafer in a lithography exposure apparatus as the wafer is positioned over a load port in accordance with some embodiments of the present disclosure.

Reference is made to FIG. 12. FIG. 12 shows a schematic cross-sectional view of one stage of a method for transporting the wafer W1 in the exposure apparatus 4 as the wafer W1 is positioned over the load port 21 in accordance with some embodiments of the present disclosure. In greater detail, the wafer W1 is retrieved from the interface module 23 to one of the slots 171 in the wafer carrier 10.

Figure 4E:
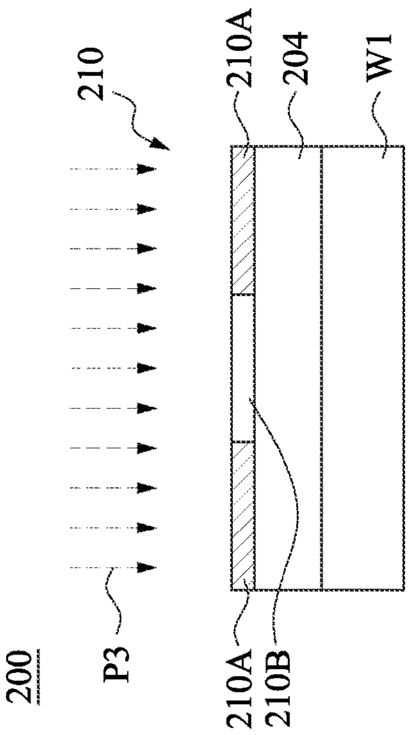

Returning to FIG. 3, the method M1 then proceeds to block S105 where the resist layer is post-baked. With reference to FIG. 4E, in some embodiments of block S105, a post-baking process P3 is performed on the resist layer 210 through a bake plate 52 in the developing apparatus (see FIG. 13A). In some embodiments, the post-bake process P3 may be used in order to assist in the generating, dispersing, and reacting of the acid/base/free radical generated from the impingement of the energy upon the photoactive compounds in the resist layer 210 during the exposure in the radiation generated by the exposing process P2 (see FIG. 4D). Such assistance can help to create or enhance chemical reactions which generate chemical differences and different polarities between the irradiated portions 210A and the unexposed portions 210B within the resist layer 210. These chemical differences results in differences in the solubility between the irradiated portions 210A and the unexposed portions 210B.

Figure 13A:
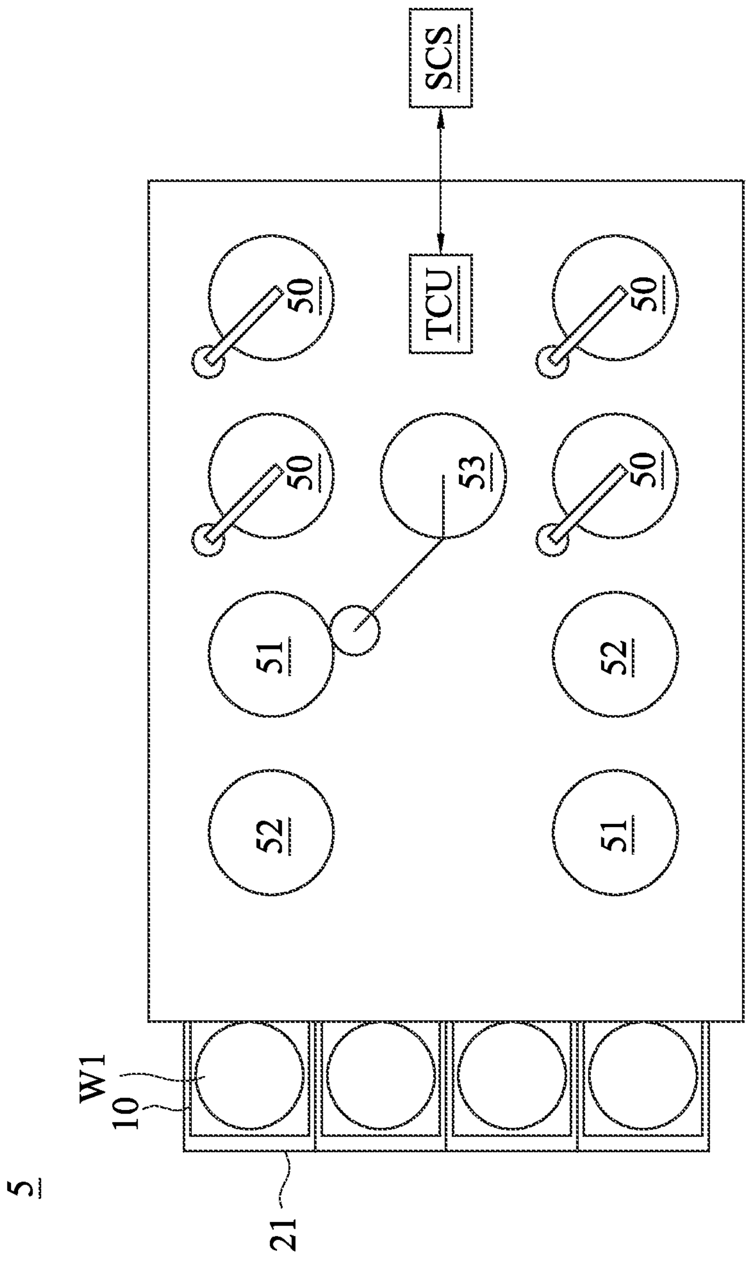
FIGS. 13A and 13B show schematic top and cross-sectional views of one stage of a method for transporting a wafer in a developing chamber in accordance with some embodiments of the present disclosure.
Figure 13B:
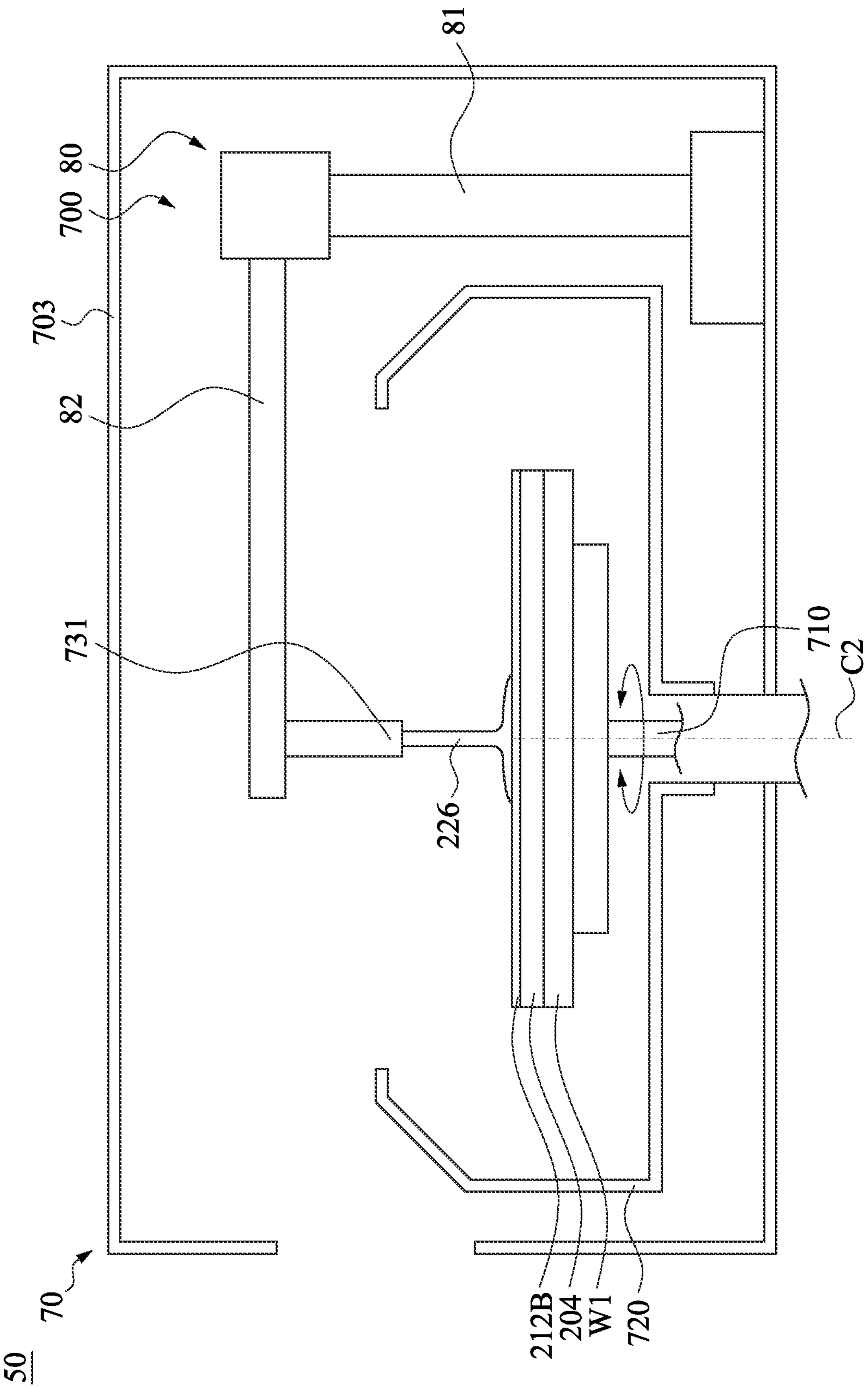

In some embodiments, the cross-sectional view of the wafer W1 in FIG. 4E will be described along with the drawing shown in FIG. 13A. Some of the described stages can be replaced or eliminated in different embodiments. As shown in FIG. 13A, after the exposing process P2 is complete, the wafer carrier 10 docked on the load port 21 of the exposure apparatus 4 retrieves the wafer W1 and then is transferred to the developing apparatus 5. Subsequently, the wafer carrier 10 is docked on the load port 21 of the developing apparatus 5, and then the wafer W1 in the wafer carrier 10 is transferred to the bake plate 52 to perform the post-baking process P3 thereon. That is, the load port 21 of the developing apparatus 5 is external to the exposure apparatus 4. As shown in FIG. 13A, the developing apparatus 5 may include processing chambers that include developing chamber 50 to develop the exposed resist layer 210 (see FIG. 4F), chill plates 51, and bake plates 52. The developing apparatus 5 may further include input/output load ports 21 and transferring module 53. The transferring module 53 can pick up wafer W1 from the input/output load ports 21, moves them between the different processing chambers and delivers then to a loading bay of the developing apparatus 5. In some embodiments, the transferring module 53 can be interchangeably referred to as a substrate handler or a robot. These devices, which are often collectively referred to as the track, are under the control of a track control unit TCU which is itself controlled by the supervisory control system SCS.

Figure 4F:
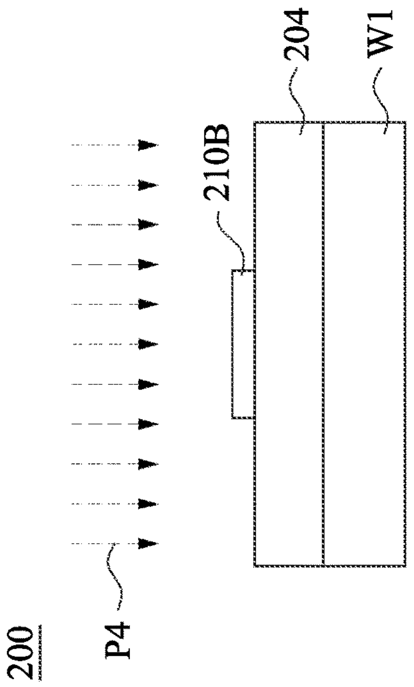

Returning to FIG. 3, the method M1 then proceeds to block S106 where the resist layer is patterned using a developing chamber. With reference to FIG. 4F, in some embodiments of block S106, a developing process P4 is performed to the exposed resist layer 210 on the wafer W1 by a dispensing nozzle 731 (see FIG. 13B) of the developing chamber 50 in the developing apparatus 5. The developing process P4 introduces a developing chemical 226 (see FIG. 13B) to the irradiated portions 210A shown in FIG. 4E. Subsequently, the irradiated portions 210A can be removed by the developing chemical 226 and results in a patterned resist 210B. In some embodiments, the developing chemical 226 may be dissolved in a solvent. In one example, the developing chemical 226 may be a positive tone developing chamber, e.g., containing tetramethylammonium hydroxide (TMAH) dissolved in an aqueous solution. In some embodiments, the developing chemical 226 may be a negative tone developing chamber, e.g., containing n-Butyl Acetate (nBA) dissolved in an organic solvent. In some embodiments, the developing chemical 226 can be interchangeably referred to as a developer. In some embodiments, the cross-sectional view of the wafer W1 in FIG. 4F will be described along with the drawings shown in FIGS. 13A and 13B. Some of the described stages can be replaced or eliminated in different embodiments. After the post-baking process P3 on the wafer W1 is complete, the wafer W1 is transferred from the bake plates 52 to the chill plate 51, and then is further transferred from the chill plate 51 to the developing chamber 50. In some embodiments, the developing process P4 is performed for a longer time duration than the exposing process P2 shown in FIG. 4D.

As shown in FIG. 13A, the developing chamber 50 may include a processing chamber 70 and a liquid dispensing module 80. The processing chamber 70 has an interior space 700 defined by a number of walls, such as a lateral wall 701, a bottom wall 702, and a top wall 703. The lateral wall 701 is connected to edges of the bottom wall 702 and extends away from the bottom wall 702. The top wall 703 is connected to the distal end of the lateral wall 701. In some embodiments, the interior space 700 is secluded from the ambient environment. The interior space 700 communicates to the ambient environment via a slot 705 formed on the lateral wall 701. The slot 705 allows the transferring module to pass through. In some embodiments, the processing chamber 70 may further include a spin chuck 710 (also referred to as a wafer stage in some embodiments) and a bowl 720. The spin chuck 710 and the bowl 720 are positioned in the interior space 700. The spin chuck 710 is configured to holding and rotating the wafer W1. The wafer W1 is placed on the spin chuck 710 and held in place by vacuum. The spin chuck 710 is rotatable and can be also referred to by a variety of names such as vacuum chuck. The spin chuck 710, for example, has a radius less than a radius of the wafer W1. The wafer W1 is positioned on the spin chuck 710 such that the wafer W1 is resting in a horizontal plane with the inactive surface, designated as the bottom, in contact with the spin chuck 710 and the opposite top surface is dispensed with desired solutions such as the developing chemical 226 shown in FIG. 13B. The spin chuck 710 is, for example, powered and rotated by a motor. The spin chuck 710 holds the wafer W1 by vacuum to allow spinning of wafer W1. In some embodiments, the wafer W1 is enclosed by the bowl 720. The bowl 720 can be moved up or down to surround the wafer W1 and collect drain and exhaust generated during developing processes. For example, drain and exhaust pipes can be connected to the underside of the bowl 720 to collect and drain out excess the developing chemical 226 in following operations.

The liquid dispensing module 80 may include a first drive mechanism 81, a second drive mechanism 82, and a dispensing nozzle 731, in accordance with some embodiments. In some embodiments, the first drive mechanism 81 is rotatable about a vertical axis as well. In some embodiments, the dispensing nozzle 731 is mounted at the second drive mechanism 82. The dispensing nozzle 731 is used to apply chemical solutions to the wafer W1. The dispensing nozzle 731 is connected to a liquid source (not shown in figures) to receive the chemical solutions. In some embodiments, the liquid dispensing module 80 controls dispensing desired solutions such as the developing chemical 226. For example, the dispensing nozzle 731 controls to dispense the developing chemical 226 onto the wafer W1, and the second drive mechanism 82 controls movements of the dispensing nozzles 731 while dispensing the developing chemical 226. In some embodiments, the dispensing nozzle 731 can be configured to drop a specific quantity onto the wafer W1 in the form of a puddle or to spray the desired quantity onto the wafer W1 in the form of a mist. In some embodiments, in some spin developing processes, the solution is dispensed prior to rotating the wafer, which is referred to as static dispense. However, in the methods according to various embodiments of the present disclosure, the developing chemical 226 is dispensed on the spinning wafer W1, which is referred to as dynamic dispense. The wafer W1 may be rotated at a first rotating speed, and then the developing chemical 226 is dispensed onto the wafer W1 at the first rotating speed. For example, the wafer W1 can be controlled by the spin chuck 710, and reach the first rotating speed. After the operation of dispensing the developing chemical 226 onto the wafer W1, the wafer W1 is rotated at a second rotating speed to spread the developing chemical 226 onto the wafer W1 uniformly.

Figure 4G:
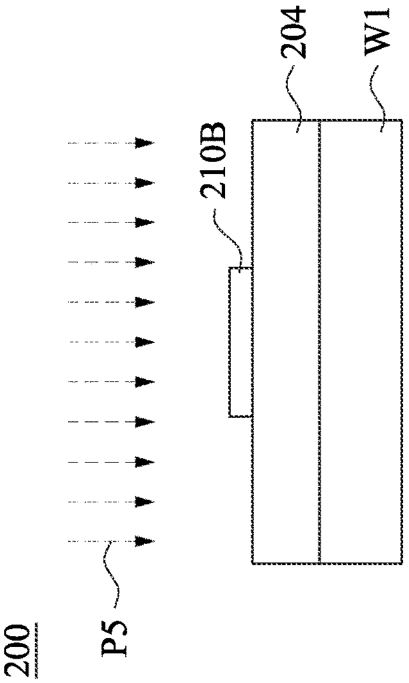

Returning to FIG. 3, the method M1 then proceeds to block S107 where the resist layer is rinsed by using a rinse solution. With reference to FIG. 4G, in some embodiments of block S107, a rinsing process P5 is performed to dispense a rinse solution 228 (see FIG. 13C) onto the wafer W1 by the dispensing nozzle 731 (see FIG. 13C) above the wafer W1. The rinsing process P5 can be in-situ performed with the developing process P4. In some embodiments, the rinsing process P5 may be ex-situ performed with the developing process P4. In some embodiments, the cross-sectional view of the wafer W1 in FIG. 4G will be described along with the drawing shown in FIG. 13C. Some of the described stages can be replaced or eliminated in different embodiments. After the developing process P4 is complete, a rinsing process P5 is performed on the wafer W1. The rinse solution 228 can be dispensed above the center of the wafer W1, or dispensed along with a predetermined path. The predetermined path can be linear, spiral, or any other proper shape to uniformly dispense the rinse solution 228 onto the wafer W1. In some embodiments, the rinse solution 228 is dispensed back and forth along the linear path corresponds to a radius of the wafer W1. In some embodiments, the rinse solution 228 can be any proper solvent to effectively wash away the irradiated portions 210A (see FIG. 4E) of the resist layer 210, which is reacted with the developing chemical 226 (see FIG. 13B). In some embodiments, the rinse solution 228 may be deionized water.

Figure 13C:
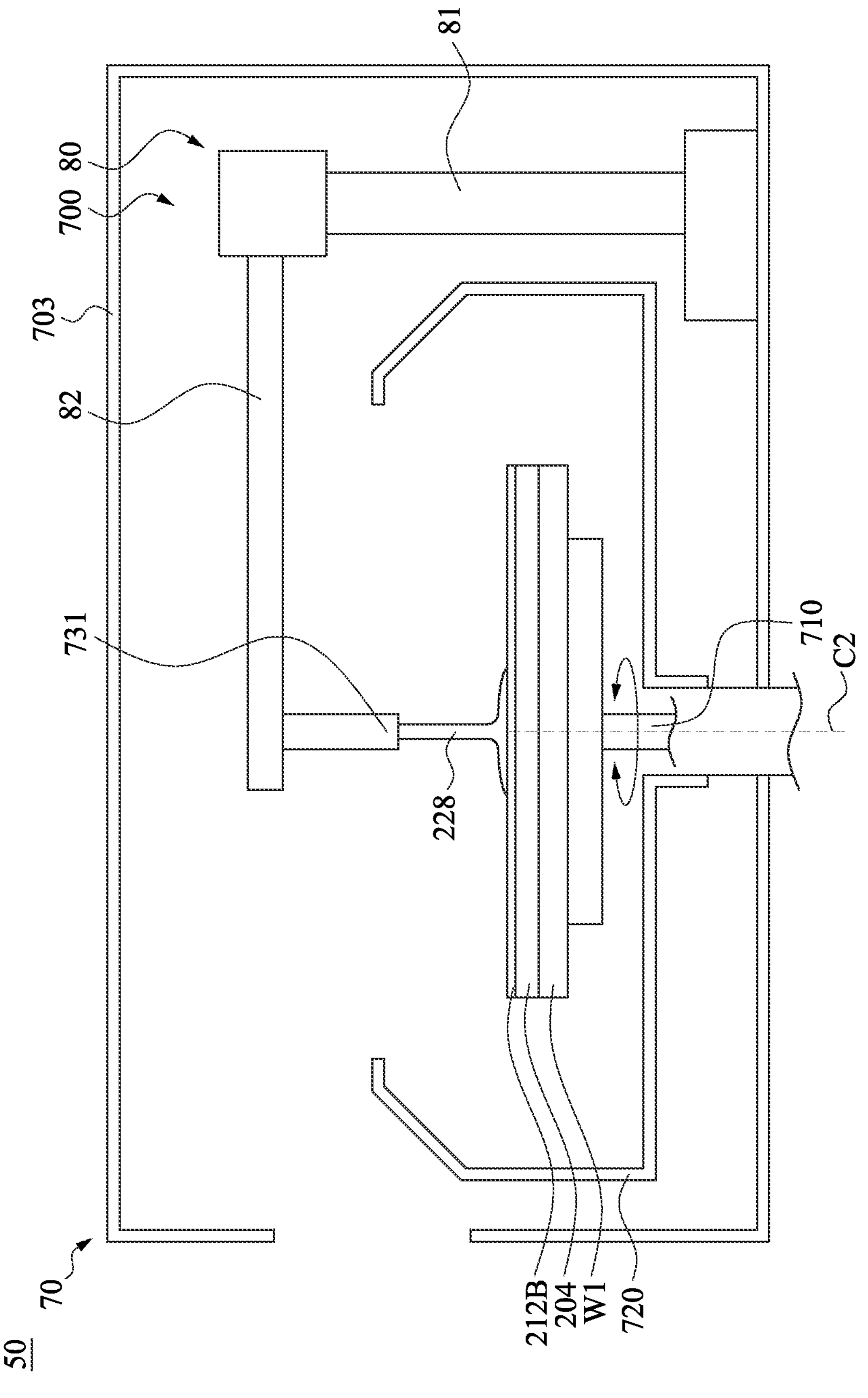
FIG. 13C shows a schematic cross-sectional view of one stage of a method of performing a rinsing process on a wafer in accordance with some embodiments of the present disclosure.

The liquid dispensing module 80 controls dispensing desired solutions such as the rinse solution 228. For example, the dispensing nozzle 731 is controlled by the liquid dispensing module 80 to dispense the rinse solution 228 onto the wafer W1. The second drive mechanism 82 controls movements of the dispensing nozzles 731 while dispensing the rinse solution 228. In some embodiments, the dispensing nozzle 731 can either be configured to drop a specific quantity onto the wafer W1 in the form of a puddle or to spray the desired quantity onto the wafer W1 in the form of a mist. In other various embodiments of the present disclosure, the liquid dispensing module 80 further includes another nozzle (not shown). In FIG. 13C, dispensing of the rinse solution 228 can be integrated into one nozzle to perform the developing and rinsing processes. In some embodiments, drain and exhaust pipes can be connected to the underside of the bowl 720 to collect and drain out a rinse solution 228.

Figure 4H:
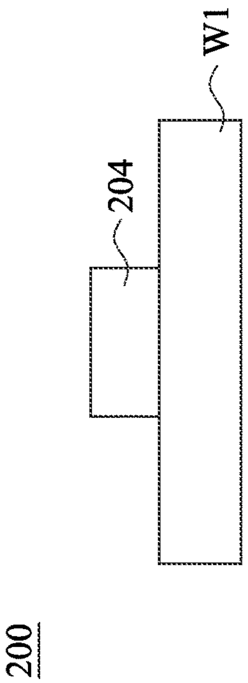

Returning to FIG. 3, the method M1 then proceeds to block S108 where the target layer is patterned by using the resist layer as a mask. With reference to FIG. 4H, in some embodiments of block S108, the target layer 204 can be patterned by using the patterned resist 210B as an etch mask, thereby transferring the pattern of the patterned resist 210B to the target layer 204. For example, the target layer 204 may be etched using a dry (plasma) etching, a wet etching, and/or other etching methods. In some embodiments, the patterned resist 210B may be partially or completely consumed during the etching of the target layer 204. In some embodiments, any remaining portion of the patterned resist 210B may be stripped off, leaving the target layer 204 over the wafer W1. The method M1 may proceed to forming a final pattern or an IC device on the target layer 204. In some embodiments, the wafer W1 may be a semiconductor substrate and the method M1 can proceed to form planar devices, such as planar FETs, fin field-effect transistors (FinFETs), or nano-FETs.

Therefore, based on the above discussions, it can be seen that the present disclosure offers advantages. It is understood, however, that other embodiments may offer additional advantages, and not all advantages are necessarily disclosed herein, and that no particular advantage is required for all embodiments. The present disclosure in various embodiments provides a method for exposing wafers having diameters, such as about 200 mm, using a lithography tool having a dual-wafer-stage configuration. The lithography tool having the dual-wafer-stage configuration can improve throughput and processing efficiency of manufacturing processes. In addition, the lithography tool can be also in a semi-track configuration, such that the lithography tool and the coater/developing chamber each have its own load ports to receiving cassette accommodating the wafers, but not be arranged in a same track, which in turn solves a mismatch issue of process time between different manufacturing processes and further improve throughput and processing efficiency of the manufacturing processes.

In some embodiments, performing a coating process on a first one of wafers to form a photoresist layer using a coating tool; after performing the coating process, retrieving the first one of the wafers to a cassette docked on the coating tool; transferring the cassette from the coating tool to a load port of an exposure tool external to the coating tool; transferring the first one of the wafers from the cassette on the load port of the exposure tool to a wafer stage of the exposure tool; performing an exposing process on the first one of the wafers to pattern the photoresist layer on the first one of the wafers. In some embodiments, the method further includes: after performing the exposing process, retrieving the first one of the wafers from the wafer stage of the exposure tool to the cassette on the load port of the exposure tool; transferring the cassette from the exposure tool to a load port of a developing tool; transferring the first one of the wafers from the cassette on the load port of the developing tool to a developing chamber in the developing tool; performing a developing process to the photoresist layer on the first one of the wafers. In some embodiments, the developing process is performed for a longer time duration than the exposing process. In some embodiments, the coating process is performed for a longer time duration than the exposing process. In some embodiments, the exposure tool is a dual-wafer-stage tool. In some embodiments, the load port of the exposure tool is at a higher position than the wafer stage of the exposure tool. In some embodiments, transferring the first one of the wafers from the cassette is performed by a transferring system, the transferring system comprises: a railway extending along the first direction, a lifter movably coupled to the railway, a rotor liftable by the lifter, a linear actuator rotatable by the rotor and movable along a second direction perpendicular to the first direction, and a wafer gripper on the linear actuator. In some embodiments, the method further includes: detecting a storage status of slots in the cassette using a metrology device positioned on the robot when the cassette is docked on the load port of the exposure tool; determining whether the storage status of the slots in the cassette is acceptable. In some embodiments, the method further includes: issuing a warning when the storage status of the slots is not acceptable. In some embodiments, the method further includes: determining whether a temperature of the robot reaches a predetermined temperature; lowering the temperature of the robot when the temperature of the robot reaches the predetermined temperature.

In some embodiments, performing an exposing process to a resist layer on a semiconductor substrate placed on a wafer stage of an exposure apparatus; after performing the exposing process, transferring the semiconductor substrate from the wafer stage via an interface module of the exposure apparatus to a front opening unified pod (FOUP) on a load port of the exposure apparatus; transferring the FOUP from the load port of the exposure apparatus to a load port of a developing apparatus external to the exposure apparatus; transferring the semiconductor substrate from the FOUP on the load port of the developing apparatus to a developing chamber in the developing apparatus; performing a developing process to the exposed resist layer on the semiconductor substrate. In some embodiments, transferring the semiconductor substrate from the wafer stage via the interface module is performed by a gripper disposed in the interface module having four degrees of freedom. In some embodiments, a movement of the gripper is driven by a linear motor providing a torque greater than about 0.64 Nm. In some embodiments, the method further includes: introducing a gas flow from above the load port of the exposure apparatus toward the load port of the exposure apparatus by a gas blowing system installed on the interface module. In some embodiments, the method further includes: exhibiting an operation status of the lithography exposure apparatus from a signal tower installed on the interface module.

In some embodiments, a factory system includes a exposure tool, a plurality of load ports, an interface module, and a transferring module. The exposure tool includes a housing and a plurality of exposure wafer stages disposed in the housing. The load ports are arranged in a first direction. The interface module is connected between the exposure tool and the load ports. The transferring module is disposed in the interface module. The transferring module includes a railway extending along the first direction, a lifter movably coupled to the railway, a rotor liftable by the lifter, a linear actuator rotatable by the rotor and movable along a second direction perpendicular to the first direction, and a wafer gripper on the linear actuator. In some embodiments, the exposure wafer stages are at a lower position than the load ports. In some embodiments, the factory system further includes a fan below the rotor. In some embodiments, the factory system further includes a wafer-mapping metrology device on the wafer gripper. In some embodiments, the factory system further includes a gas blowing system in the interface module and higher than the plurality of load ports.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method, comprising:

performing a coating process on a first one of wafers to form a photoresist layer using a coating tool;

after performing the coating process, retrieving the first one of the wafers to a cassette docked on the coating tool;

transferring the cassette from the coating tool to a load port of an exposure tool external to the coating tool;

transferring the first one of the wafers from the cassette on the load port of the exposure tool to a wafer stage of the exposure tool, wherein the exposure tool comprises an interface module and a vacuum vessel connected to the interface module, wherein the interface module comprises a sealed space, a first door opening connected to the cassette on the load port, and a second door opening connected to the vacuum vessel, wherein the load port of the exposure tool is disposed outside the sealed space and adjacent to the first door opening, wherein the wafer stage is disposed in the vacuum vessel and is at a lower position than the load port; and performing an exposing process on the first one of the wafers to pattern the photoresist layer on the first one of the wafers.

2. The method of claim 1, further comprising:

after performing the exposing process, retrieving the first one of the wafers from the wafer stage of the exposure tool to the cassette on the load port of the exposure tool;

transferring the cassette from the exposure tool to a load port of a developing tool;

transferring the first one of the wafers from the cassette on the load port of the developing tool to a developing chamber in the developing tool; and performing a developing process to the photoresist layer on the first one of the wafers.

3. The method of claim 2, wherein the developing process is performed for a longer time duration than the exposing process.

4. The method of claim 1, wherein the coating process is performed for a longer time duration than the exposing process.

5. The method of claim 1, wherein the exposure tool is a dual-wafer-stage tool.

6. The method of claim 1, wherein transferring the first one of the wafers from the cassette is performed by a transferring system disposed in the interface module, the transferring system comprises:

a railway extending along a first direction;

a lifter movably coupled to the railway;

a rotor liftable by the lifter;

a linear actuator rotatable by the rotor and movable along a second direction perpendicular to the first direction; and a wafer gripper on the linear actuator.

7. The method of claim 6, further comprising:

detecting a storage status of slots in the cassette using a metrology device positioned on the wafer gripper when the cassette is docked on the load port of the exposure tool; and determining whether the storage status of the slots in the cassette is acceptable.

8. The method of claim 6, further comprising:

determining whether a temperature of the wafer gripper reaches a predetermined temperature; and lowering the temperature of the wafer gripper when the temperature of the wafer gripper reaches the predetermined temperature.

9. The method of claim 1, wherein transferring the first one of the wafers from the cassette on the load port of the exposure tool to the wafer stage comprises moving the first one of the wafers by a transfer module disposed in the interface module through the first door opening into the sealed space and through the second door opening into the vacuum vessel.

10. A method, comprising:

performing an exposing process to a resist layer on a semiconductor substrate placed on a wafer stage of an exposure apparatus;

before opening a movable door cover between a sealed space of an interface module of the exposure apparatus and a front opening unified pod (FOUP) on a load port of the exposure apparatus, detecting, by a gas pressure detector of a gas blowing system disposed above the load port, a gas pressure state around the FOUP or the load port, and adjusting a strength of a fan filter of the gas blowing system according to the detected gas pressure state so that the gas pressure state reaches a predetermined state;

after adjusting the strength of the fan filter, transferring the semiconductor substrate from the wafer stage via the interface module the FOUP on the load port of the exposure apparatus;

transferring the FOUP from the load port of the exposure apparatus to a load port of a developing apparatus external to the exposure apparatus;

transferring the semiconductor substrate from the FOUP on the load port of the developing apparatus to a developing chamber in the developing apparatus; and performing a developing process to the exposed resist layer on the semiconductor substrate.

11. The method of claim 10, wherein transferring the semiconductor substrate from the wafer stage via the interface module is performed by a gripper disposed in the interface module and having four degrees of freedom.

12. The method of claim 11, wherein a movement of the gripper is driven by a linear motor providing a torque greater than 0.64 Nm.

13. The method of claim 10, further comprising:

exhibiting an operation status of the exposure apparatus from a signal tower installed on the interface module.

14. The method of claim 10, wherein a sealing element is disposed between a housing of the interface module and the movable door cover, and wherein the gas blowing system comprises a housing supported by the housing of the interface module, and the fan filter, the gas pressure detector, and a gas filter element are disposed in the housing of the gas blowing system.

15. A method, comprising:

positioning a wafer carrier at a load port of a lithography exposure apparatus, wherein the lithography exposure apparatus is separated from a coating apparatus and a developing apparatus;

before transferring a wafer from the wafer carrier, adjusting a strength of a cooling system based on a temperature of a wafer transfer gripper;

performing an aerodynamics simulation to determine whether a gas flow driven by the cooling system disturbs particles and contaminates the wafer;

adjusting the strength of the cooling system in response to the aerodynamics simulation indicating that the gas flow causes particle contamination of the wafer;

transferring a wafer from the wafer carrier by the wafer transfer gripper;

moving the wafer transfer gripper from a first height corresponding to the load port to a second height lower than the first height and corresponding to a first wafer stage of the lithography exposure apparatus;

placing the wafer onto the first wafer stage;

exposing the wafer on the first wafer stage; and after completing exposure, transferring the wafer from the first wafer stage back to the wafer carrier by the wafer transfer gripper.

16. The method of claim 15, wherein the lithography exposure apparatus operates independently from the coating apparatus and the developing apparatus without sharing a common load port.

17. The method of claim 15, wherein the lithography exposure apparatus further comprises a second wafer stage.

18. The method of claim 17, further comprising exposing the wafer on the first wafer stage while another wafer is positioned on the second wafer stage.

19. The method of claim 15, further comprising:

after exposing the wafer, transferring the wafer to the developing apparatus that is arranged in a track different from a track of the lithography exposure apparatus, and performing a developing process on the wafer in the developing apparatus.

20. The method of claim 15, wherein the temperature of the wafer transfer gripper is detected by a temperature detector disposed on the wafer transfer gripper and electrically connected to a control unit, and wherein the control unit performs the aerodynamics simulation and adjusts the strength of the cooling system according to a result of the aerodynamics simulation.

* * * * *